(12) United States Patent
Cui et al.

(10) Patent No.: US 8,039,776 B2
(45) Date of Patent: Oct. 18, 2011

(54) QUANTITATIVE DIFFERENTIAL INTERFERENCE CONTRAST (DIC) MICROSCOPY AND PHOTOGRAPHY BASED ON WAVEFRONT SENSORS

(75) Inventors: Xiquan Cui, Pasadena, CA (US); Changhuei Yang, Pasadena, CA (US); Guillermo J. Tearney, Cambridge, MA (US)

(73) Assignees: California Institute of Technology, Pasadena, CA (US); The General Hospital Corporation, Cambridge, MA (US)

( * ) Notice: Subject to any disclaimer, the term of this patent is extended or adjusted under 35 U.S.C. 154(b) by 210 days.

(21) Appl. No.: 12/435,165

(22) Filed: May 4, 2009

(65) Prior Publication Data

US 2009/0276188 A1    Nov. 5, 2009

Related U.S. Application Data

(60) Provisional application No. 61/126,441, filed on May 5, 2008.

(51) Int. Cl.
*G01J 1/20* (2006.01)
(52) U.S. Cl. .................................. 250/201.9; 250/208.1
(58) Field of Classification Search ............... 250/201.9, 250/208.1, 216, 226; 356/121, 512–516; 359/846–849
See application file for complete search history.

(56) References Cited

U.S. PATENT DOCUMENTS

| | | | |
|---|---|---|---|
| 4,438,330 A | 3/1984 | Hardy | |
| 4,692,027 A | 9/1987 | MacGovern et al. | |
| 4,737,621 A * | 4/1988 | Gonsiorowski et al. | ... 250/201.9 |
| 5,196,350 A | 3/1993 | Backman et al. | |
| 5,426,505 A | 6/1995 | Geiser et al. | |
| 5,798,262 A | 8/1998 | Garini et al. | |
| 6,753,131 B1 | 6/2004 | Rogers et al. | |
| 6,858,436 B2 | 2/2005 | Zenhausern et al. | |
| 2005/0271548 A1 | 12/2005 | Yang et al. | |
| 2006/0175528 A1 | 8/2006 | Greenway et al. | |
| 2007/0207061 A1 | 9/2007 | Yang et al. | |
| 2007/0258096 A1 | 11/2007 | Cui et al. | |
| 2009/0225319 A1 | 9/2009 | Lee et al. | |

OTHER PUBLICATIONS

Booth, M. et al., "Adapative aberration correction in a confocal microscope," Proceedings of the National Academy of Sciences of the United States of America, vol. 99, No. 9, Apr. 30, 2002, pp. 5788-5792.

Choi, W. et al., "Tomographic phase microscopy," Nature Methods, vol. 4, No. 9, Sep. 2007, pp. 717-719.

Cogswell, C. et al., "Confocal differential interference contrast (DIC) microscopy: including a theoretical analysis of conventional and confocal DIC imaging," Journal of Microscopy, vol. 165, pt. 1, Jan. 1992, pp. 81-101.

(Continued)

*Primary Examiner* — Que T Le
(74) *Attorney, Agent, or Firm* — Sheila Martinez-Lemke

(57) ABSTRACT

A wavefront microscope or camera utilizes a wavefront sensor to measure the local intensity and phase gradient of the wavefront and output image maps based on the intensity and phase gradient. A wavefront sensor provides a metal film having patterned structured two dimensional (2D) apertures that convert a phase gradient of a wavefront into a measurable form onto a photodetector array. A computer is used to analyze the data by separating signals projected and recorded on the array from the different apertures, predict a center of each projection, and sum signals for each projection to display the intensity while determining a center position change/offset from the predicted center to display the phase gradient of the wavefront.

18 Claims, 17 Drawing Sheets

OTHER PUBLICATIONS

Cui, X. et al., "Slanted hole array beam profiler (SHArP)—a high-resolution portable beam profiler based on a linear aperture array," Optics Letters, vol. 31, No. 21, Nov. 1, 2006, pp. 3161-3163.

Cui, X. et al., "Quantitative differential interference contrast microscopy based on structured-aperture interference," Applied Physics Letters, vol. 93, 2008, pp. 091113-1-091113-3.

Davidson, M. et al., "Differential interference contrast, 'Comparison of wavelength of DIC microscopy'," Florida State University website, last website modification Jul. 26, 2005, printed Apr. 13, 2009, 12 pages.

Heng, X. et al. "Optofluidic microscopy—a method for implementing a high resolution optical microscope on a chip," Lab Chip, vol. 6, 2006, pp. 1274-1276.

Lew, M. et al., "Interference of a four-hole aperture for on-chip quantitative two-dimensional differential phase imaging," Optics Letters, vol. 32, No. 20, Oct. 15, 2007, pp. 2963-2965.

Liang, J. et al., "Supernormal vision and high-resolution retinal imaging through adaptive optics," J. Opt. Soc. Am. A, vol. 14, No. 11, Nov. 1997, pp. 2884-2892.

Marquet, P. et al., "Digital holographic microscopy: a noninvasive contrast imaging technique allowing quantitative visualization of living cells with subwavelength axial accuracy," Optics Letters, vol. 30, No. 5, Mar. 1, 2005, pp. 468-470.

Thompson, R. et al., "Precise nanometer localization analysis for individual fluorescent probes," Biophysical Journal, vol. 82, May 2002, pp. 2775-2783.

Schwiegerling, J. et al., "Historical development of the Shack-Hartmann wavefront sensor," Robert Shannon and Roland Shack Legends in Applied Optics, SPIE—International Society for Optical Engineering, 2005, six pages.

Adaptive optics, Wikipedia, last modified Mar. 17, 2009, five pages.

Differential interference contrast microscopy, Wikipedia, last modified Feb. 10, 2009, four pages.

Shack-Hartmann, Wikipedia, last modified Mar. 30, 2009, one page.

Zone plate, Wikipedia, last modified Apr. 2, 2009, three pages.

Albensi, B. C., et al., "Elements of Scientific Visualization in Basic Neuroscience Research," BioScience, vol. 54, pp. 1127-1137 (2004).

Anand, Arun, et al., "Wavefront sensing with random amplitude mask and phase retrieval," Optics Letters, vol. 32, No. 11, pp. 1584-1585 (Jun. 2007).

Arnison, M.R., et al., "Linear Phase Imaging Using Differential Interference Contrast Microscopy," Journal of Microscopy, vol. 214, Part. I, pp. 7-12 (Apr. 2004).

Barty, A., et al., "Quantitative optical phase microscopy," Optics Letters, vol. 23, pp. 817-819 (1998).

Betzig, E., et al., "Imaging intracellular fluorescent proteins at nanometer resolution," Science, vol. 313, pp. 1642-1645 (2006).

Bouwkamp, C. J., "Diffraction theory," Reports on Progress in Physics XVIII, pp. 35-100 (1954).

Carmon, Y., and Ribak, E. N., "Phase retrieval by demodulation of a Hartmann-Shack sensor," Opt. Commun., vol. 215, pp. 285-288 (2003).

Chalut, K. J., et al., "Quantitative phase microscopy with asynchronous digital holography," Optics Express, vol. 15, pp. 3047-3052 (2007).

Creath, K., "Phase-measurement interferometry techniques," Prog. Opt., vol. 26, p. 44 (1988).

Cui, Xiquan, et al., "Portable optical microscope-on-a-chip," Photonics West, San Jose, CA (Jan. 2006).

Drezet, et al., "Miniature plasmonic wave plates," Physical Review Letters, vol. 101, p. 43902 (2008).

Dunn, et al., "Introduction to Confocal Microscopy," available from MicroscopyU at http://www.microscopyu.com/articles/confocal (2007).

Ebbesen, T. W., et al., "Extraordinary optical transmission through sub-wavelength hole arrays," Nature, vol. 391, No. 6668, pp. 667-669 (Feb. 1998).

Fu, Anne Y., et al., "A microfabricated fluorescence-activated cell sorter," Nature Biotechnology, vol. 17, No. 11, pp. 1109-1111 (Nov. 1999).

Garcia De Abajo, F. J., "Light transmission through a single cylindrical hole in a metallic film," Optics Letters, vol. 10, No. 25, pp. 1475-1484 (2002).

Haglund, M. M., et al., "Enhanced optical imaging of human gliomas and tumor margins," Neurosurgery, vol. 38, pp. 308-317 (1996).

Heng, Xin, et al., "Characterization of light collection through a subwavelength aperture from a point source," Optics Express, vol. 14, pp. 10410-10425 (2006).

Heng, Xin, et al., "Optofluidic Microscope, a miniature microscope on a chip," 9th International Converence on Miniaturized Systems for Chemistry and Life Sciences (µTAS) (2005).

Heng, Xin, et al., "Optofluidic Microscopy," Proceedings of the ICMM 2005 3rd International Conference on Microchannels and Minichannels, pp. 1-6 (2005).

Hoffman, R., and Gross, L., "The modulation contrast microscope," Nature, vol. 254, pp. 586-588 (1975).

Hogenboom, C. A., et al., "Three-dimensional images generated by quadrature interferometry," Optics Letters, vol. 23, pp. 783-785 (1998).

Ikeda, T., et al., "Hilbert phase microscopy for investigating fast dynamics in transparent systems," Optics Letters, vol. 30, pp. 1165-1167 (2005).

Kagalwala, Farhana, and Kanade, Takeo, "Reconstructing Specimens Using DIC Microscope Images," IEEE Transactions on Systems, Man, and Cybernetics-Part B: Cybernetics, vol. 33, No. 5 (Oct. 2003).

Liu, Shaorong R., "A microfabricated hybrid device for DNA sequencing," Electrophoresis 2003, vol. 24, No. 21, pp. 3755-3761 (2003).

Mehta, S. B., et al., "Quantitative phase-gradient imaging at high resolution with asymmetric illumination-based differential phase contrast," Optics Letters, vol. 34, pp. 1924-1926 (2009).

Murphy, et al., "Differential Interference Contrast (DIC)," available from Nikon MicrocopyU at http://www.microscopyu.com/articles/dic/dicindex.html (2007).

Popescu, G., et al., "Diffraction phase microscopy for quantifying cell structure and dynamics," Optics Letters, vol. 31, pp. 775-777 (2006).

Popescu, G., et al., "Optical measurement of cell membrane tension," Physical Review Letters 97 (2006).

Preza, Chrysanthe, "Rotational-Diversity Phase Estimation from Differential-Interference Contrast Microscopy Images," J. Opt. Soc. Am. A, vol. 17, No. 3 (Mar. 2000).

Rappaz, B. et al. "Measurement of the integral refractive index and dynamic cell morphometry of living cells with digital holographic microscopy," Optics Express, vol. 13, pp. 9361-9373 (2005).

Rueckel, M., et al., "Adaptive wavefront correction in two-photon microscopy using coherence-gated wavefront sensing," Proceedings of the National Academy of Sciences of the USA, vol. 103, pp. 17137-17142 (2006).

Rust, M. J., et al., "Sub-diffraction-limit imaging by stochastic optical reconstruction microscopy (STORM)," Nature Methods, vol. 3, pp. 793-795 (2006).

Sarunic, V., et al., "Full-field swept-source phase microscopy," Optics Letters, vol. 31, pp. 1462-1464 (2006).

Sommer, R.J, and Sternberg, P.W., "Changes of induction and competence during the evolution of vulva development in nematodes," Science 265, pp. 114-118 (1994).

Stanley, S.L., "Amoebiasis," Lancet 361, pp. 1025-1034 (2003).

Tegenfeldt, Jonas O., et al., "Micro- and nanofluidics for DNA analysis," Analytical and Bioanalytical Chemistry, vol. 378, No. 7, pp. 1678-1692 (2004).

Tegenfeldt, Jonas O., et al., "Near-field Scanner for Moving Molecules," Physical review letters, vol. 86, No. 7, pp. 1378-1381 (Feb. 2001).

Tokeshi, Manabu, et al., "Chemical processing on microchips for analysis, synthesis, and bioassay," Electrophoresis, vol. 24, No. 21, pp. 3583-3594 (2003).

Trau, D., et al., "Genotyping on a complementary metal oxide semiconductor silicon polymerase chain reaction chip with integrated DNA microarray," Analytical Chemistry, vol. 74, No. 13, pp. 3168-3173 (2002).

Wu, J. G., et al., "Full field phase imaging using a harmonically matched diffraction grating pair based homodyne quadrature interferometer," Applied Physics Letters, vol. 90, p. 3 (2007).

Yaqoob, Z., "Harmonically-related diffraction gratings-based interferometer for quadrature phase measurements," Optics Express, vol. 14, pp. 8127-8137 (2006).

Zernike, R., "Phase contrast, a new method for the microscopic observation of transparent objects," Physics 9, pp. 686-698 (1942).

* cited by examiner

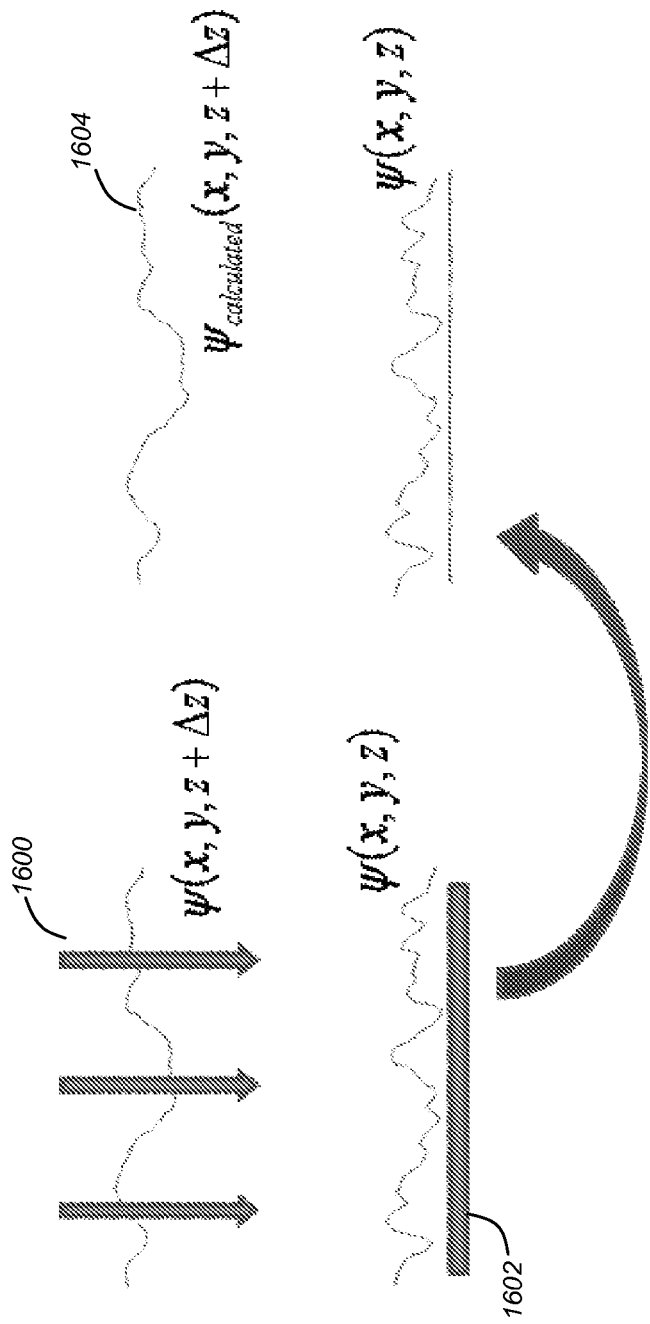

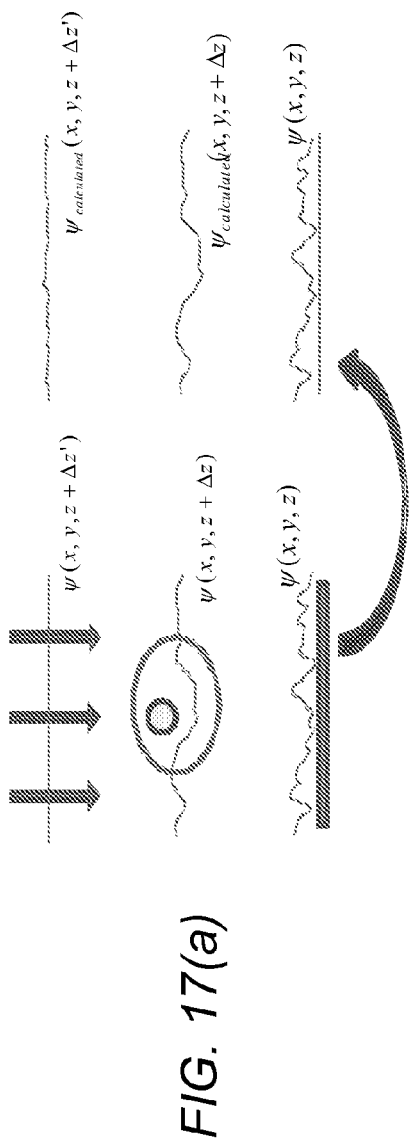
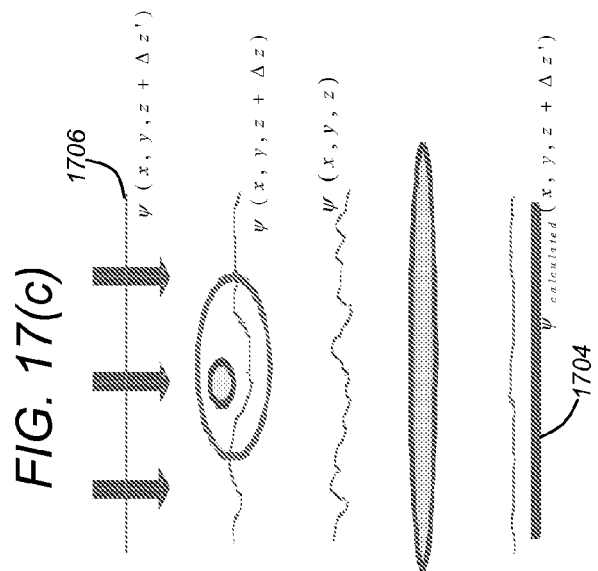
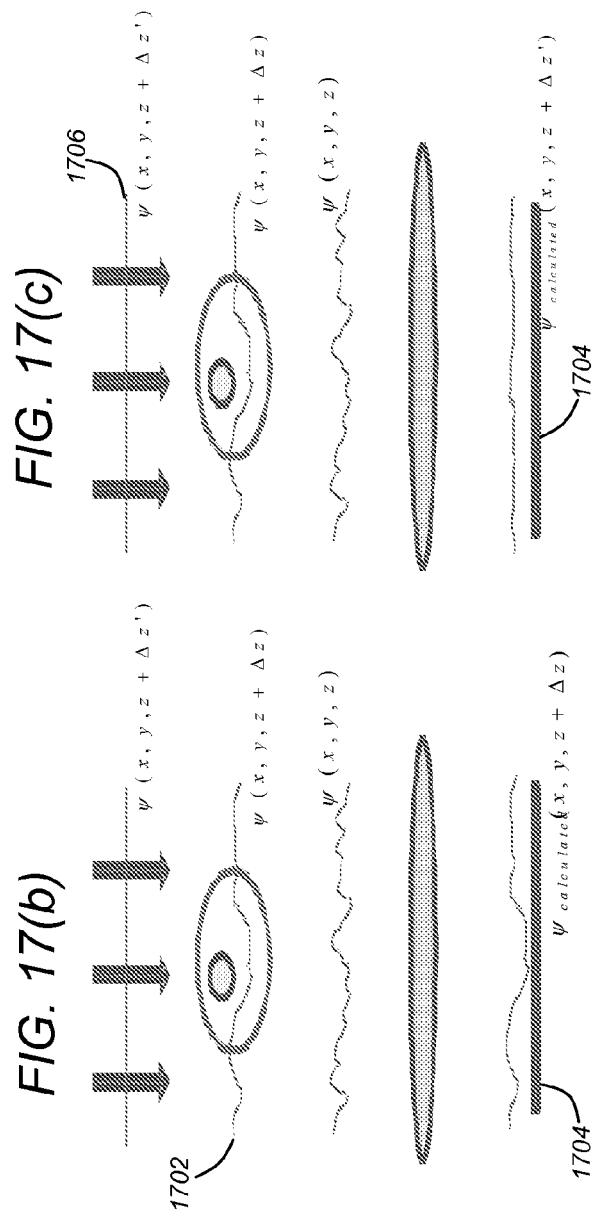
FIG. 17(a)
FIG. 17(b)
FIG. 17(c)

US 8,039,776 B2

QUANTITATIVE DIFFERENTIAL INTERFERENCE CONTRAST (DIC) MICROSCOPY AND PHOTOGRAPHY BASED ON WAVEFRONT SENSORS

CROSS-REFERENCE TO RELATED APPLICATIONS

This application claims the benefit under 35 U.S.C. Section 119(e) of the following and commonly-assigned U.S. provisional patent application(s), which is/are incorporated by reference herein:

Provisional Application Ser. No. 61/126,441, filed on May 5, 2008, by Xiquan Cui and Changhuei Yang, entitled "QUANTITATIVE DIFFERENTIAL INTERFERENCE CONTRAST (DIC) MICROSCOPY BASED ON WAVEFRONT SENSORS."

This application is related to the following co-pending and commonly-assigned patent applications, which applications are incorporated by reference herein:

U.S. patent application Ser. No. 11/743,581, filed on May 2, 2007, by Xiquan Cui, Xin Heng, Demetri Psaltis, Axel Scherer, and Changhuei Yang, entitled "ON-CHIP PHASE MICROSCOPE/BEAM PROFILER BASED ON DIFFERENTIAL INTERFERENCE CONTRAST AND/OR SURFACE PLASMON ASSISTED INTERFERENCE," now U.S. Pat. No. 7,768,654, which application claims priority to the following applications: Provisional Application Ser. No. 60/796,997, filed on May 2, 2006, by Xiquan Cui, Xin Heng, and Changhuei Yang, entitled "DIFFERENTIAL INTERFERENCE CONTRAST (DIC) MICROSCOPE BASED ON YOUNG'S INTERFERENCE;" and Provisional Application Ser. No. 60/796,996, filed on May 2, 2006, by Xin Heng, Xiquan Cui, Axel Scherer, Demetri Psaltis, and Changhuei Yang, entitled "SURFACE PLASMON ASSISTED OPTOFLUIDIC MICROSCOPE;" and U.S. patent application Ser. No. 11/686,095, filed on Mar. 14, 2007, by Changhuei Yang and Demetri Psaltis, entitled "OPTOFLUIDIC MICROSCOPE DEVICE," now U.S. Pat. No. 7,751,048, which application is a continuation-in-part application of U.S. patent application Ser. No. 11/125,718, filed on May 9, 2005, now U.S. Pat. No. 7,773,227, which is a non-provisional of and claims priority to U.S. provisional patent application Nos. 60/590,768, filed on Jul. 23, 2004, and 60/577,433, filed on Jun. 4, 2004. Application Ser. No. 11/686,095 is also a non-provisional of, and claims the benefit of the filing date of U.S. provisional patent application No. 60/783,920, filed on Mar. 20, 2006.

BACKGROUND OF THE INVENTION

1. Field of the Invention

The present invention relates generally to microscopy and photography, and in particular, to differential interference contrast (DIC) microscopy and photography based on wavefront sensors.

2. Description of the Related Art (Note: This application references a number of different publications as indicated throughout the specification by reference numbers enclosed in brackets, e.g., [x]. A list of these different publications ordered according to these reference numbers can be found below in the section entitled "References." Each of these publications is incorporated by reference herein.)

Differential interference contrast (DIC) microscopy renders excellent contrast for optically transparent biological samples without the need to introduce any exogenous contrast agents into the samples. Due to this noninvasive nature, DIC microscopes are widely used in biology laboratories. However, the conventional DIC technique has several limitations. One major disadvantage is that the conventional DIC microscope translates phase variations into amplitude (intensity) variations, and therefore phase variations cannot be easily disentangled from amplitude variations that arise from sample absorption and/or scattering [1]. In other words, conventional DIC microscopes are inherently qualitative as a consequence of nonlinear phase gradient response and entanglement of amplitude and phase information. In addition, conventional DIC images of birefringent samples can have significant artifacts as the conventional DIC microscope depends on polarized light and uses polarization in its phase imaging strategy.

SUMMARY OF THE INVENTION

One or more embodiments of the invention provide a quantitative DIC microscopy or photography method based on a wavefront sensor. Such a sensor may be either a structured-aperture (SA) wavefront sensor or a microlens aperture based sensor (i.e., a Shack Hartmann sensor). Benefiting from the unique features of such a wavefront sensor, a DIC microscopy or photography system separates the amplitude and the phase gradient information of the image wavefront, and forms quantitative intensity and DIC images of the sample with good resolution (~2 μm or less). Furthermore, since embodiments of the invention utilize unpolarized light and contain no polarization-dependent components, birefringent samples can be imaged (e.g., potato starch storage granules) without artifacts. Finally, unlike most of the recently developed quantitative phase microscopy techniques, embodiments of the invention can be used with a standard microscope light-source.

BRIEF DESCRIPTION OF THE DRAWINGS

Referring now to the drawings in which like reference numbers represent corresponding parts throughout:

FIG. 6(a) illustrates a configuration of a structured aperture wavefront sensor in accordance with one or more embodiments of the invention;

FIGS. 6(b), 6(d), and 6(f) illustrate different patterned structured apertures used in the configuration of FIG. 6(a) while FIGS. 6(c), 6(e), and 6(g) illustrate resulting images from the patterned structured apertures of FIGS. 6(b), 6(d), and 6(f) respectively, and FIG. 6(h) illustrates a Fresnel-zone plate structured aperture with a circular frame;

FIG. 13(a) illustrates a conventional transmission microscope image; FIG. 13(b) illustrates a conventional DIC microscope image; FIG. 13(c) illustrates intensity, FIG. 13(d) illustrates X DIC phase images from a structured aperture DIC microscope, and FIG. 13(e) illustrates Y DIC phase images from a structured aperture DIC microscope;

FIG. 14(a) illustrates a conventional microscope image; FIG. 14(b) illustrates maltese-cross artifacts in a conventional DIC image; FIG. 14(c) illustrates intensity and is artifact free; FIG. 14(d) illustrates X DIC phase images from a structured aperture DIC microscope, and FIG. 14(e) illustrates Y DIC phase images from a structured aperture DIC microscope;

FIG. 16 illustrates the approach for the propagation of light in accordance with one or more embodiments of the invention; and FIG. 17 illustrates an approach for the propagation of light using a computer (17(a)) and using a microscope (17(b) and 17(c)) in accordance with one or more embodiments of the invention.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

One or more embodiments of the invention provide a mechanism to create a simple, quantitative and birefringent-artifact-free DIC microscopy or photography method with wavefront sensors.

Configuration of the Quantitative Differential Interference Contrast (DIC) Microscopy Based on Wavefront Sensors Using conventional microscopy, a sample may be illuminated and a photodetector may be used to receive the diffracted light. Two types of information are desirable based on the illumination—(1) the number/distribution of photons; and (2) the direction/wavefront slope/phase gradient of the photons. Conventional microscopy fails to provide the phase gradient of the photons diffracted by a sample. Further, as described above, due to the dependency on polarized light, conventional techniques further fail to provide accurate results with birefringement samples (i.e., samples that have double refraction where the direction of light diffracted through the sample will depend on the polarization of the light). Accordingly, what is needed is a mechanism that is not dependent on polarized light that is further able to provide the phase gradient of the light after interacting with the sample.

Embodiments of the invention provide the ability to measure both (1) the number/distribution of photons, and (2) the phase gradient of the photons on birefringent and homogeneous samples. A DIC microscopy-based system of embodiments of the invention may utilize wavefront sensors in two different configurations: (1) a single pixel wavefront sensor scheme; or (2) a wavefront sensor array scheme. To better understand these two configurations, a close examination of convention DIC microscopy is useful.

Figure 1:
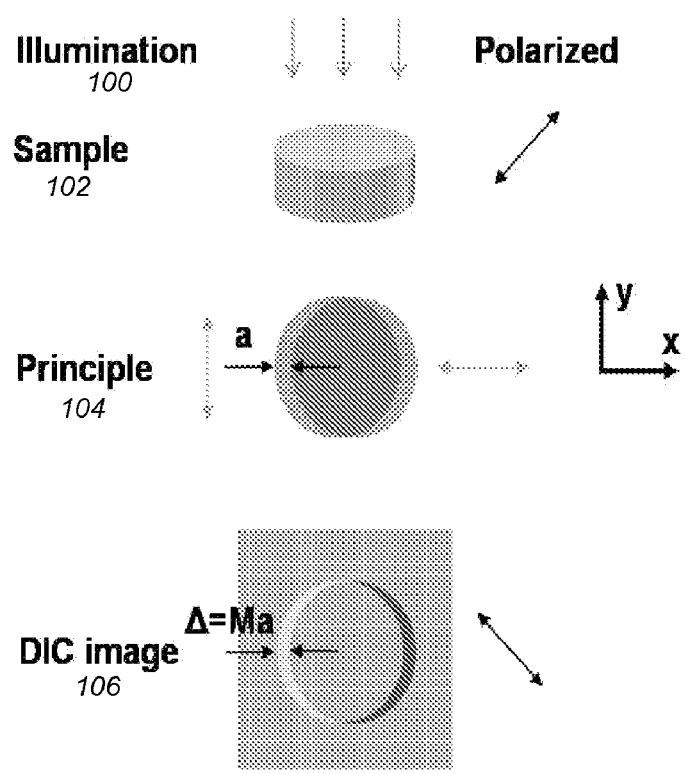
FIG. 1 illustrates a conventional DIC microscope system that operates by interfering slightly displaced duplicate image light fields.

In essence, a conventional DIC microscope operates by first creating two identical illumination light fields through polarization selection. FIG. 1 illustrates a conventional DIC microscope system that operates by interfering slightly displaced duplicate image light fields. As illustrated, the light fields 100 are laterally displaced (displacement=a) with respect to each other (along the x-direction) and are transmitted through the sample 102. A net phase lag 104 (typically $\pi/2$) is then introduced on one of the transmitted image light fields. The two light fields 100 are allowed to interfere with each other at the image plane 106. More simply, the process is equivalent to simply duplicating the transmitted image light field, laterally displacing the copy slightly (i.e., at 104) and interfering the two light fields (at image plane 106).

Mathematically, this implies that the observed conventional DIC intensity image from a microscope with a magnification factor of M is given by:

$$I_{DIC}(x, y) = |\psi_{DIC}(x, y)|^2 \quad (1)$$
$$= B(x, y) + C(x, y) * \sin(\arg(\psi(x - \Delta/2, y)) - \arg(\psi(x + \Delta/2, y)))$$
$$\approx B(x, y) + C(x, y) * (\arg(\psi(x - \Delta/2, y)) - \arg(\psi(x + \Delta/2, y)))$$

where $B(x, y) = |(\psi(x-\Delta/2, y))|^2 + |(\psi(x+\Delta/2, y))|^2$, $C(x, y) = 2|(\psi(x-\Delta/2, y))||(\psi(x+\Delta/2, y))|$, and $\psi(x, y)$ is the image wavefront as relayed by the microscope for each light field, $\psi_{DIC}(x, y)$ is the DIC image wavefront, and $\Delta = Ma$ is the relative displacement of the images associated with the light fields. The last expression in Eq. (1) is valid only in situations where the phase difference is small.

Figure 2:
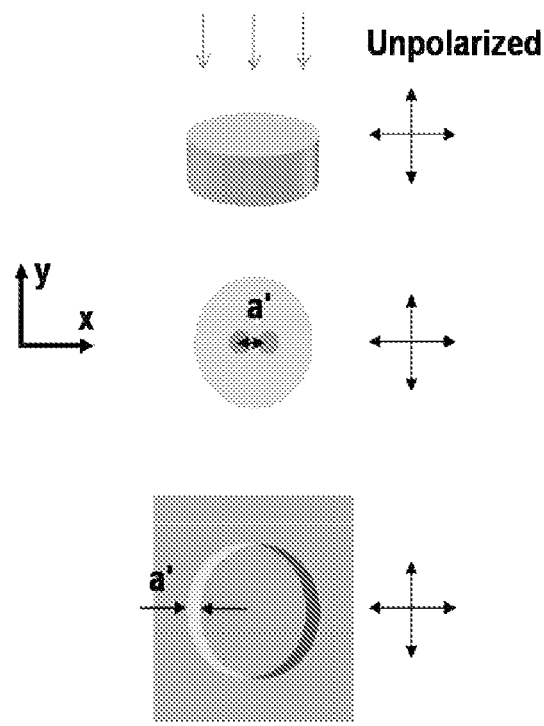
FIG. 2 illustrates a structured aperture differential contrast microscope that operates by interfering light from two adjacent points on the image light field in accordance with one or more embodiments of the invention.

A similar phase comparison can also be performed by acquiring a simple microscope image of the object and selectively combining-and-interfering the light fields at two adjacent points of the image (separation=a') as illustrated in FIG. 2. Such a phase comparison is employed in a DIC imaging method of one or more embodiments of the invention.

Single Pixel Wavefront Sensor Scheme

Figure 3:
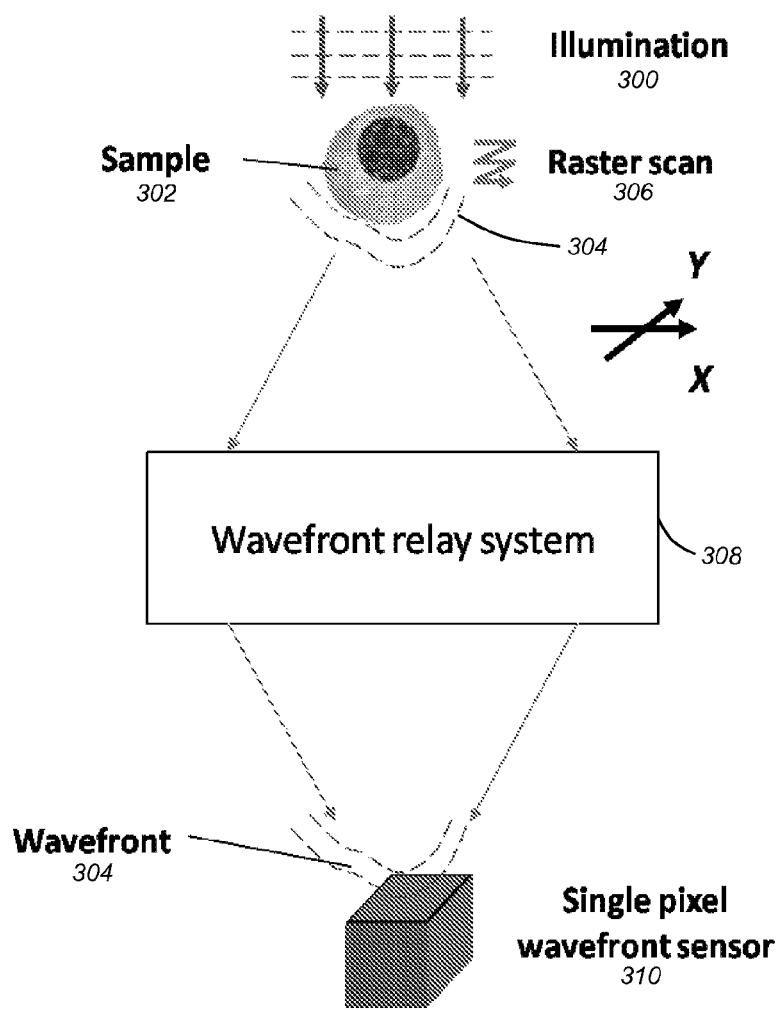
FIG. 3 illustrates a configuration for DIC microscopy based on wavefront sensors using a single pixel wavefront sensor scheme in accordance with one or more embodiments of the invention.

A first configuration for DIC microscopy based on wavefront sensors is that of a single pixel wavefront sensor scheme as illustrated in FIG. 3. The light source 300 illuminates a sample 302 which diffracts/refracts the light into a shaped wavefront 304.

A wavefront relay system 308 is used to project the wavefront 304 generated by the sample 302 onto a single pixel wavefront sensor 310. The sensor 310 measures the local intensity (i.e., number/distribution of the photons) and phase gradient of the wavefront 304 induced by the sample 302 which conjugates with the sensor pixel 310. By raster-scanning 306 the sample 302 or the sensor pixel 310, two-dimensional (2D) maps of the local intensity/distribution and phase gradient of the wavefront 304 modulated by the sample 302 can be achieved at the same time.

Wavefront Sensor Array Scheme

Figure 4:
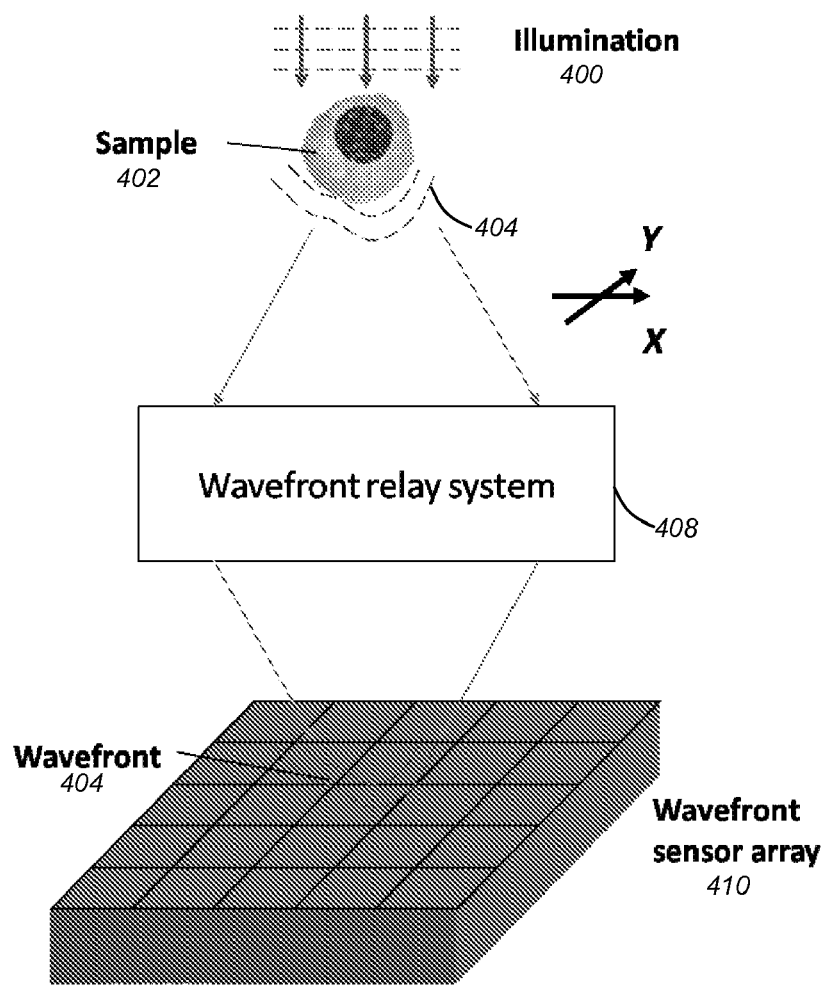
FIG. 4 illustrates a configuration for DIC microscopy based on wavefront sensors using a wavefront sensor array scheme in accordance with one or more embodiments of the invention.

A second configuration for DIC microscopy based on wavefront sensors is that of a wavefront sensor array scheme as illustrated in FIG. 4. Similar to FIG. 3, the light source 400 illuminates the sample 402 which diffracts/refracts the light into a shaped wavefront 404.

The relay system 408 is used to project the wavefront 404 generated by the sample 402 onto a wavefront sensor array 410. Each pixel of the wavefront sensor array 410 measures the local intensity/distribution and phase gradient of the wavefront 404 induced by the sample point 402 which conjugates with the sensor pixel. In this case, 2D maps of the local intensity/distribution and phase gradient of the wavefront 404 modulated by the sample 402 are obtained naturally at the same time. In addition, the sample 402 or the sensor array 410 can be raster-scanned to form more densely sampled images.

Configuration Benefits and Alternatives

Since embodiments of the invention do not depend on the polarization of the illumination, artifact-free DIC images can be obtained (using unpolarized illumination), for both birefringent and homogenous samples. In addition, the imaging scan 306 may be performed in many other ways. For example, a 2D raster scan 306 can be replaced by a one-dimensional (1D) OFM (opto-fluidic microscope) scanning scheme as described in U.S. patent application Ser. Nos. 11/686,095 and 11/743,581 which are incorporated by reference herein. Further, sample scanning can be replaced by wavefront sensor 310/410 scanning Lastly, embodiments of the invention can be used to target transparent samples, cell level or larger. In this regard, there is no constraint with respect to the size of the sample.

In view of the above described configurations, embodiments of the invention provide a new DIC microscopy method where the DIC functionality of a microscope is integrated onto the detector. Such integration is advantageous over conventional DIC microscopy methods which use bulky optical elements in the microscope. Accordingly, embodiments of the present invention are more compact, less expensive, less tedious in training and preparation, and more convenient to operate by users than conventional DIC methods.

Use in a microscope can involve a wavefront-sensing sensor chip that is placed into a camera-port compatible housing for the chip. The entire unit can be plugged into the camera port of a microscope and used to capture simultaneous amplitude and phase images.

Nonetheless, embodiments of the invention can be utilized in adaptive optics as part of a wavefront sensing component. The term adaptive optics refers to systems that operate by measuring distortions in a wavefront and compensating for them with a spatial phase modulator such as a deformable mirror or liquid crystal array.

Wavefront Sensors

Multiple types of wavefront sensors 310/410 may be used in accordance with one or more embodiments of the invention. The wavefront sensor, which can measure the local intensity/distribution and phase gradient of the wavefront modulated by the sample at the same time, can be implemented in several ways. Two different cases are presented: (1) structured aperture interference and (2) Shack-Hartmann schemes. Both sensors can be used as either a single pixel 310 or an arrayed wavefront sensor 410, and form quantitative DIC microscopes of the configurations described above.

Structured Aperture (SA) Wavefront Sensor

The basic concept of the SA sensor is similar to the Young's double-slit phase decoding scheme described in U.S. patent application Ser. Nos. 11/743,581 and 11/686,095, which are fully incorporated by reference herein.

Figure 5:
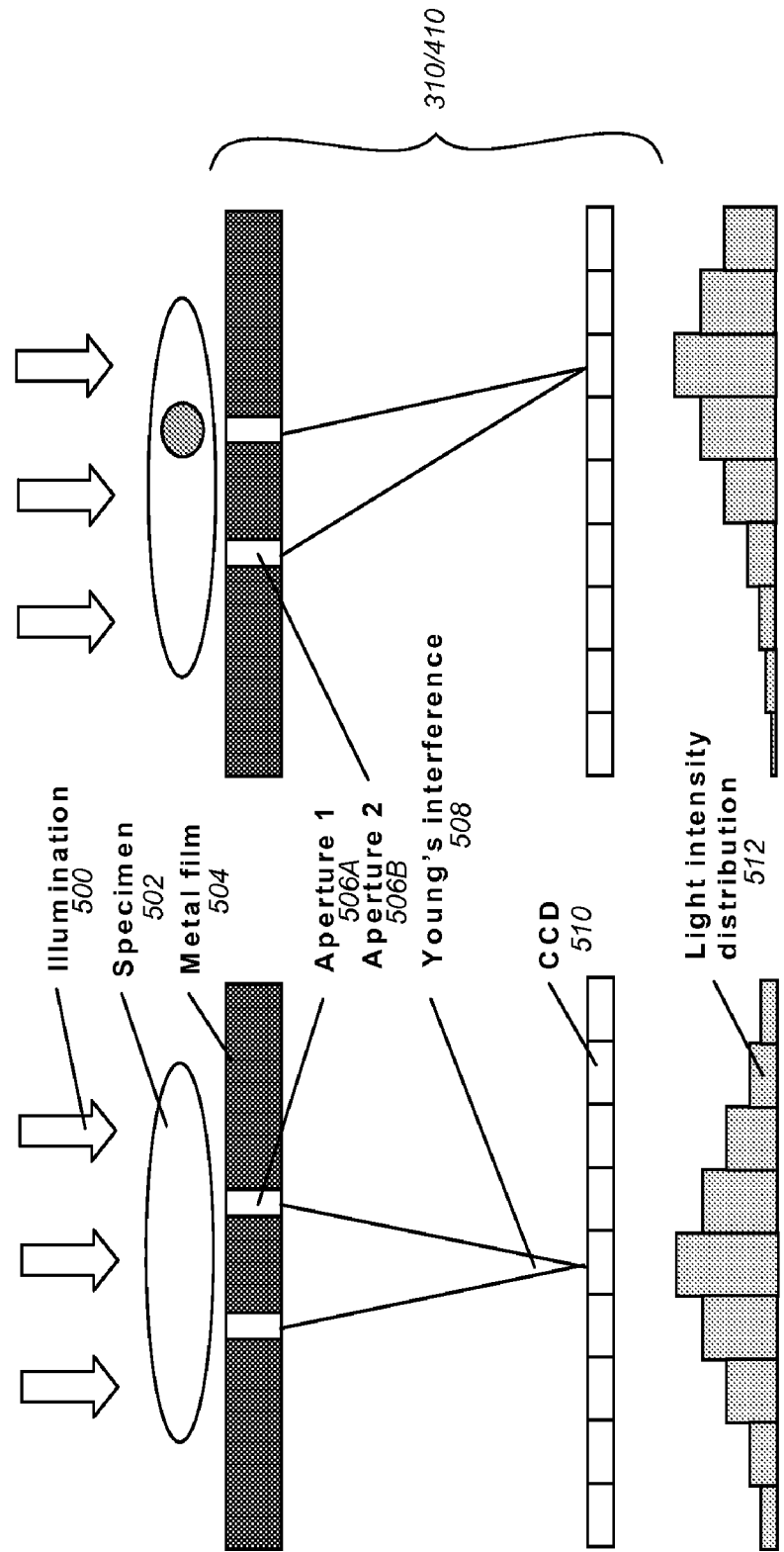
FIG. 5 illustrates a configuration of a wavefront sensor used in accordance with one or more embodiments of the invention.

FIG. 5 illustrates a configuration of a wavefront sensor 310/410 used in accordance with one or more embodiments of the invention. A light source 500 is used to illuminate a sample/specimen 502. A metal film 504 has apertures 506 (i.e., 506A and 506B) which are used to focus the diffracted/refracted light from the sample (i.e., in accordance with Young's interference 508) onto a photodetector array such as a charge coupled device (CCD) 510. The photodetector array 510 can be used to determine the light intensity distribution 512. The local phase gradient of the wavefront 304/404 (that is focused via apertures 506) is determined by examining the offset of the zero diffraction order on the back photodetector array 510. The local intensity 512 of the wavefront is determined by integrating the diffracted signal on the photodetector array 510.

Figure 6:
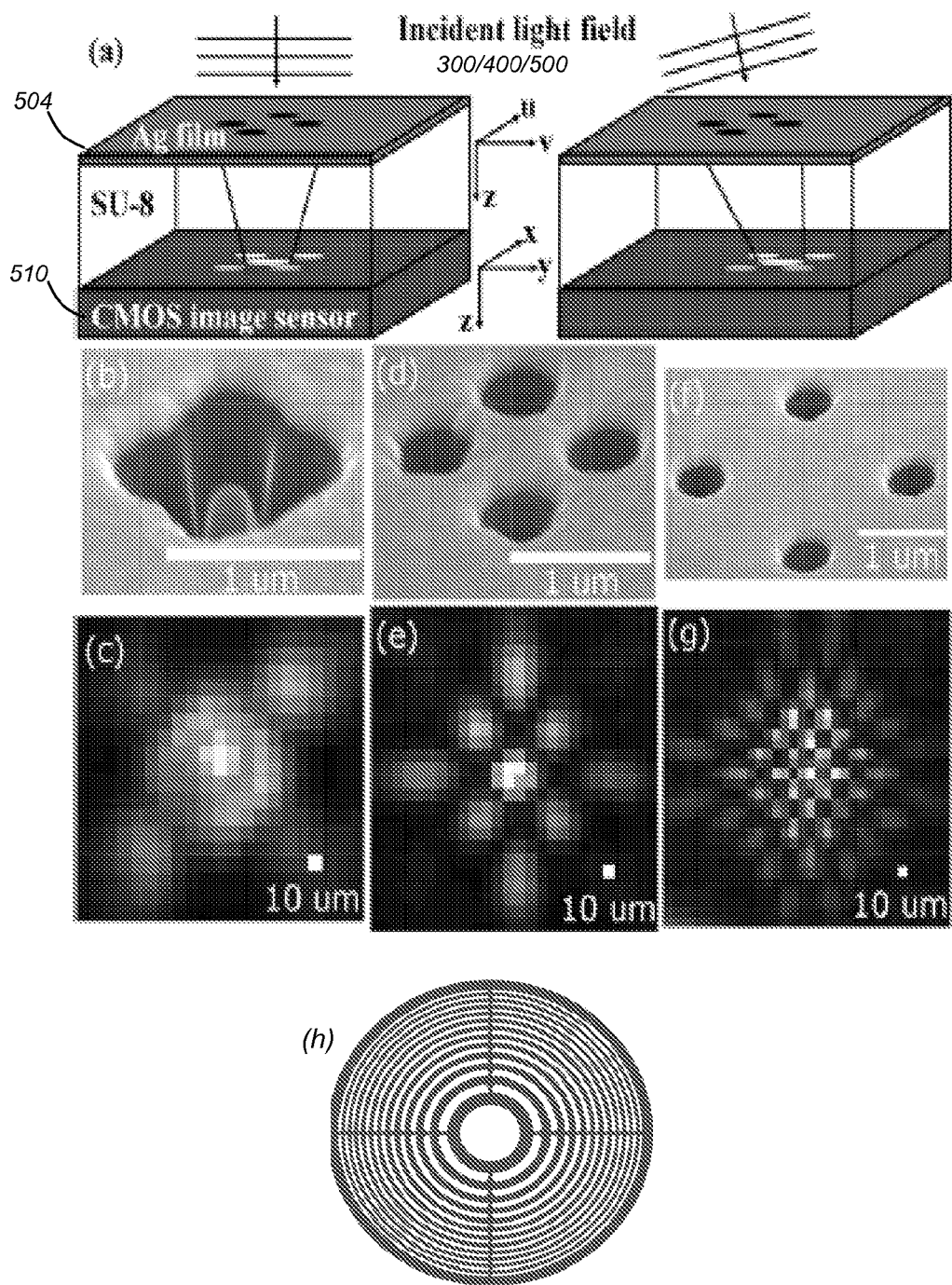

One or more embodiments of the invention utilize varieties of 2D structured apertures including four holes, petal-shaped, a single hole, a ring or Fresnel zone plate (some are illustrated in FIG. 6). As illustrated in FIG. 6(a), the incident light field 300/400/500 (e.g., received from the wavefront relay system 308/408) passes through apertures in the metal (e.g., silver) film where the light is projected (e.g., through a transparent polymer such as SU-8 resin) onto an image sensor (e.g., CMOS image sensor). The light may be projected at different angles (e.g., left side of FIG. 6(a)) v. right side of FIG. 6(a) resulting in a different projection onto the image sensor 510.

FIGS. 6(b), 6(d), and 6(f) illustrate the different structured aperture patterns (via scanning electron microscope images) while FIGS. 6(c), 6(e), and 6(g) illustrate the resulting interference pattern of the respective aperture patterns recorded by the photodetector/image sensor 510. FIGS. 6(b) and 6(c) illustrate a petal-shaped aperture and resulting interference pattern; FIGS. 6(d) and 6(e) illustrate a four (4) structured aperture and resulting interference pattern; and FIGs. 6(f) and 6(g) illustrate a 4-hole structured aperture (with round holes) and resulting interference pattern. FIG. 6(h) illustrates a Fresnel-zone plate structured aperture with a circular frame. Using a Fresnel zone plate or ring based structured aperture, one can shrink a projected sport FWHM (full width half maximum) by appropriate design.

With these 2D structured apertures (i.e., illustrated in FIGS. 6(b), 6(d), and 6(f) as examples), one can measure the local phase gradient of the wavefront 304/404 along both orthogonal directions X and Y at the same time. As used herein, such an aperture-based phase decoding scheme is referred to as SA wavefront sensing.

As illustrated in FIG. 6, the sensor of the invention 310/410 includes the metal film based apertures 504 and photodetector/image sensor 510. The sensor 510 is used to receive the wavefront shaped by the sample. Wherever the projection is received onto the sensor 510, the resulting image may be used to represent a single pixel. As in FIG. 3, raster scanning may be used to capture an image of the entire sample. Alternatively, as in FIG. 4, multiple sensors 310/410 may be arranged in a 2D array to capture the entire sample in a single snapshot.

The 4-hole aperture and single hole aperture sensor measure the spatial phase gradient of the light field. Mathematically, one measures:

$$G_x(x,y)=k_x(x,y)/k_o \approx (d\phi(x,y)/dx)/k_o$$

$$G_y(x,y)=k_y(x,y)/k_o \approx (d\phi(x,y)/dy)/k_o$$

$$A(x,y)$$

with an aperture sensor.

As such, one can mathematically reconstruct the observed wavefront at the sensor by combining the information appropriately. One approach is:

$$\psi_{measured}(x, y, z) = A_{measured}(x, y, z) \exp\left(ik_o \left(\int_0^x G_x(x, y=0)dx + \int_0^y G_y(x, y)dy\right)\right)$$

Numerous approaches for reconstructing a field distribution exist (unwrapping). The methods should all return the same answer if the SNR (signal to noise ratio) of the measurement approaches infinity. The methods vary in their performance based on the quantity and type of noise present in the measurements.

Figure 7:
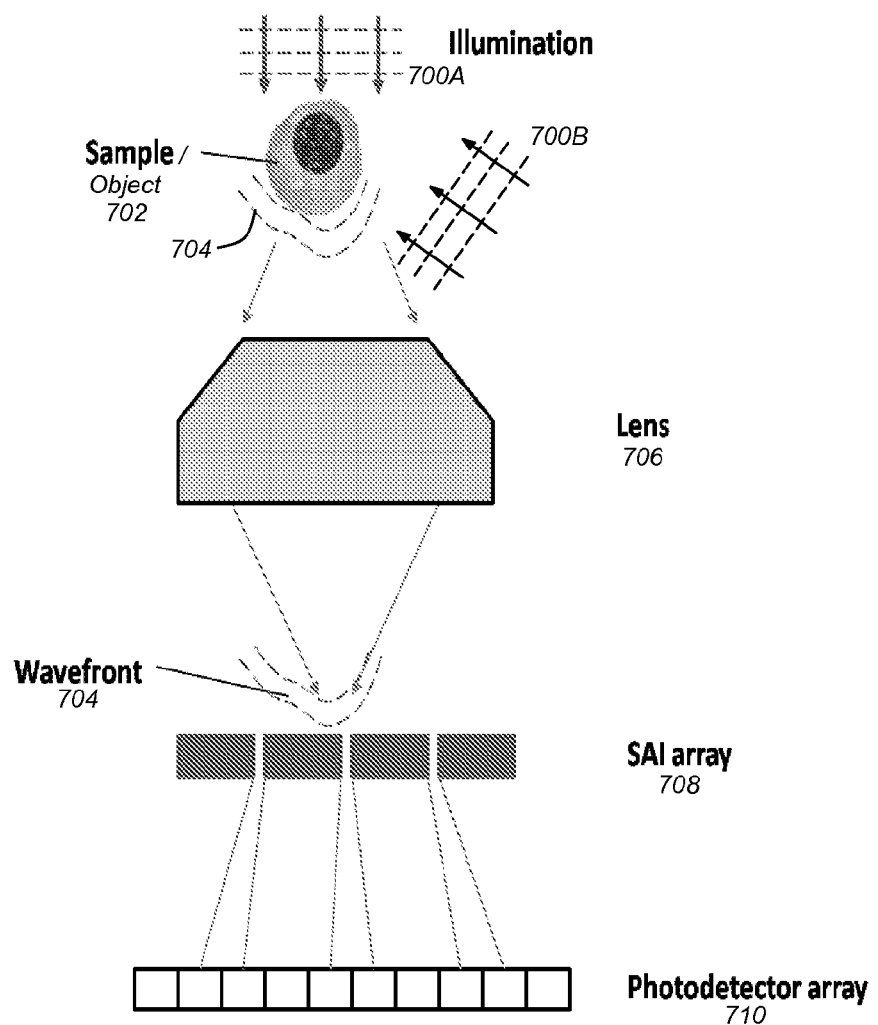
FIG. 7 illustrates an example of a side-view of a DIC microscope system constructed by an SA wavefront sensor array in accordance with one or more embodiments of the invention.

FIG. 7 illustrates an example of a side-view of a DIC microscope system (and wavefront camera system as described below) constructed by an SA wavefront sensor array in accordance with one or more embodiments of the invention. The light source 700 illuminates 700A the sample 702 causing a wavefront 704 to pass through a relay system such as lens 706. The wavefront passes through the SA array 708 which causes the light to project onto the photodetector array 710. As illustrated, FIG. 7 depicts a 3-aperture SA array 708.

Shack-Hartmann Wavefront Sensor

Figure 8:
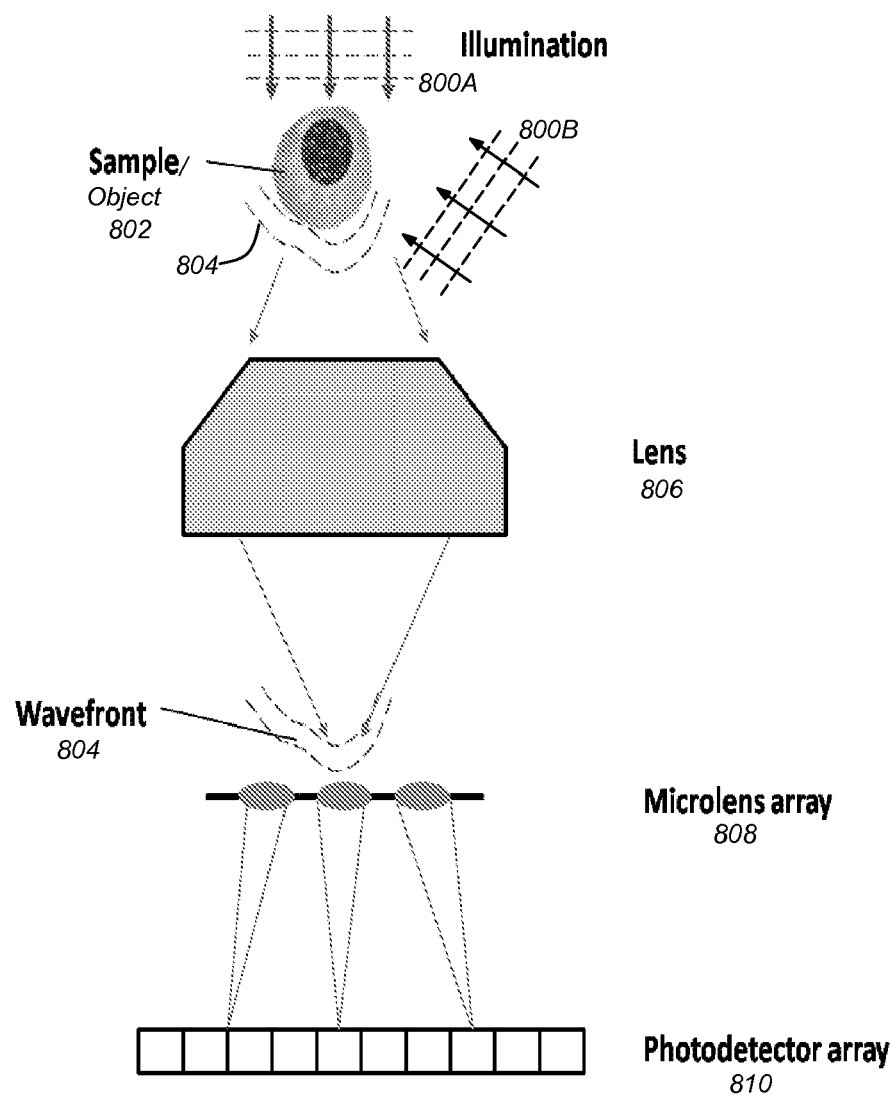
FIG. 8 illustrates a Shack-Hartmann wavefront sensor in a DIC microscope system in accordance with one or more embodiments of the invention.

One or more embodiments of the invention utilize a Shack-Hartmann wavefront sensor in a DIC microscope system (and wavefront camera system described below) as illustrated in FIG. 8. As with the SA wavefront sensor implementation, a light source 800 illuminates 800A a sample 802 to generate a wavefront 804 which passes through a wavefront relay system such as lens 806. The Shack-Hartmann sensor consists of an array 808 of microlenses of the same focal length. Each microlens in the array 808 focuses the local wavefront 804 across each lens and forms a spot onto a photodetector array 810. The local phase gradient of the wavefront 804 can then be calculated from the position of the focal spot on the sensor 810. The history and principles of Shack-Hartmann wavefront sensing is further described in [3] and [4]. However, prior art Shack-Hartmann sensors have been limited in their use and have not been used in microscopy or DIC/phase based microscopy.

It is also worth noting that the diffraction spot size in SA wavefront sensors and the focal spot size in the Shack-Hartmann wavefront sensors can be used to determine the spread of wave vector k at any given image point. It is useful for rendering images where the extent of scattering is plotted (amongst other things).

Wavefront Detection

SA wavefront sensors can be used in a variety of wavefront sensing applications including adaptive optics [3], optical testing [3], adaptive microscopy [5], retina imaging [6], etc. In an SA wavefront sensor of the invention, structured apertures are used on a metal film to convert the phase gradient of a wavefront into a measurable form—the offset of the projection of the aperture. Shack-Hartmann wavefront sensors utilize a microlens array to perform the conversion. The simplicity of the structured apertures provides the ability to build the SA wavefront sensor in an easier and more cost-effective way than Shack-Hartmann sensors. In addition, the spacing between structured apertures can be much smaller than that between the microlenses of a Shack-Hartmann sensor, which are usually spaced more than 100 µm apart to sense slowly invarying wavefronts. Further, the SA wavefront sensor provides for high spatial resolution and much denser wavefront sampling for use in detecting complicated wavefronts generated by many biological samples.

One may note that wavefront sensing using SA and Shack-Hartmann wavefront sensors does not only apply to monochromatic illumination, but also applies to broad band light illumination. The feasibility of such broad band light illumination is described in [13] which is fully incorporated by reference herein. In this regard, wavefront sensing applies to a monochromatic light field distribution in which k is well defined at each point on the image plane. However, wavefront sensing may also be used for a broadband light source and with situations where k at any given point may be a mix of different wave vectors. In this regard, wavefront sensors can be used with broadband light illumination, monochromatic illumination with mixed k, and broadband light illumination with mixed k. Such capabilities may be better understood with a description of computed depth sectioning ability.

For purposes of the following discussion, assume that a light field is linearly polarized and that no interaction of the light field will depolarize or in any other way disrupt polarization. Under a first concept, the light field at any given plane can be fully described by a complete set of spatially varying amplitude and phase information. In other words, a light field at plane z can be described by:

$$\psi(x,y,z)=A(x,y,z)\exp(i\phi(x,y,z))$$

Under a second concept, Huygen's Principle states that the light field at a earlier or later (higher or lower z value) can be calculated from the light field at plane z. In other words, a known function (f) connects:

$$\psi(x,y,z+\Delta z)=f(\psi(x,y,z),\Delta z)$$

The function f is well known and studied in EM (electromagnetic) theory (see [14]). This computation assumes that the absence of unknown scattering objects between plane z and plane (z+Δz).

These two concepts are powerful when applied to phase imaging in the context of embodiments of the present invention. It implies that if we can measure the phase and amplitude distribution at the plane of the sensor (optofluidic microscope [OFM] floor—see details described herein), one can calculate and render the light field distributions at different heights above the sensor. These light field distributions are, in effect, images at those chosen planes.

FIG. 16 illustrates the approach for the propagation of light in accordance with one or more embodiments of the invention. The propagation of the light field is governed by Maxwell's equations entirely. If one measures the phase and amplitude distribution of the light field 1600 at the sensor 1602, such information can be used to calculate the light field distribution at any given plane above the sensor (or below the sensor). The amplitude distribution of the computed light field is equivalent to the traditional microscope image taken at the focal plane 1604 set at z+Δz. This treatment is strictly true if no unknown object (e.g., sample) is present between the plane z (i.e., at the sensor 1602) and z+Δz (1604).

FIG. 17 illustrates an approach for the propagation of light using a computer (17(*a*)) and using a microscope (17(*b*) and 17(*c*)). The imaging of an unknown but weak scatterer can be performed computationally (e.g., as illustrated in FIG. 17(*a*)) by using the same mathematical frame work as described above—by ignoring the presence of the scatterer during the calculation and back-computing the light field at z+Δz.

The amplitude distribution of the computed light field is equivalent to the traditional microscope image (e.g., as illustrated in FIG. 17(*b*)) taken at the focal plane set at z+Δz. In fact, the amplitude distribution is identical. In the traditional microscope (i.e., FIGS. 17(*b*) and 17(*c*)), the calculation is performed optically by the optical elements. By adjusting the optics, you can bring different planes into focus but effectively, one is making slight adjustments to the optical computing process. As an example, FIG. 17(*b*) illustrates a microscope based approach where the optics are tuned to focus on the plane z+Δz 1702. The resulting distribution of such a focal plane 1702 is apparent at the sensor 1704. Similarly, in FIG. 17(*c*), the optics are tuned to focus on plane z+Δz' 1706 which is also apparent at sensor 1704.

The process may not be perfect because one may fail to achieve a good image if the sample is thick and/or highly scattering because the assumption that scattering is negligible in the computation process is violated in this case. However, this problem affects computation-based depth sectioning and optical-based sectioning equally.

The axiom of 'no free lunch' applies equally in both situations. For thin tissue sections or cell samples, the distortion is nominally tolerable. In practical situations, one can typically deal with a 100 μm thick tissue sample before distortion starts becoming significant.

One may also note that with computation based sectioning, a sensor capable of spatially measuring amplitude and phase may be needed. Further, the signal to noise ratio (SNR) of the sensor movements may have to be high. Otherwise, the computed images may be poor in quality.

Wavefront Camera

Embodiments of the invention can also be implemented by insertion of a SA wavefront sensor (FIG. 7) or a Shack-Hartmann wavefront sensor (FIG. 8) into a camera system instead of microscope. Such an embodiment in camera imaging provides similar advantages and benefits to that of a microscopy based embodiment. For example, one can not only capture the intensity information of the projected object wavefront onto the image sensor, but the phase gradient of the projected object wavefront can also be detected. In FIG. 7 the light source 700 illuminates 700B an object 702 wherein the remaining elements are similar to the microscopy based device described above. Similarly, in FIG. 8, the light source 800 illuminates 800B the object 802 (which could be a person, or other object that is being captured via the wavefront camera) with the remaining elements similar to the microscopy based device described above. As illustrated in FIGS. 7 and 8, the illumination 700B and 800B reflects off of the object 802 to generate a wavefront 704/804 that is passed to the lens and eventually reaches the photodetector array 710/810.

Data Analysis

Figure 9:
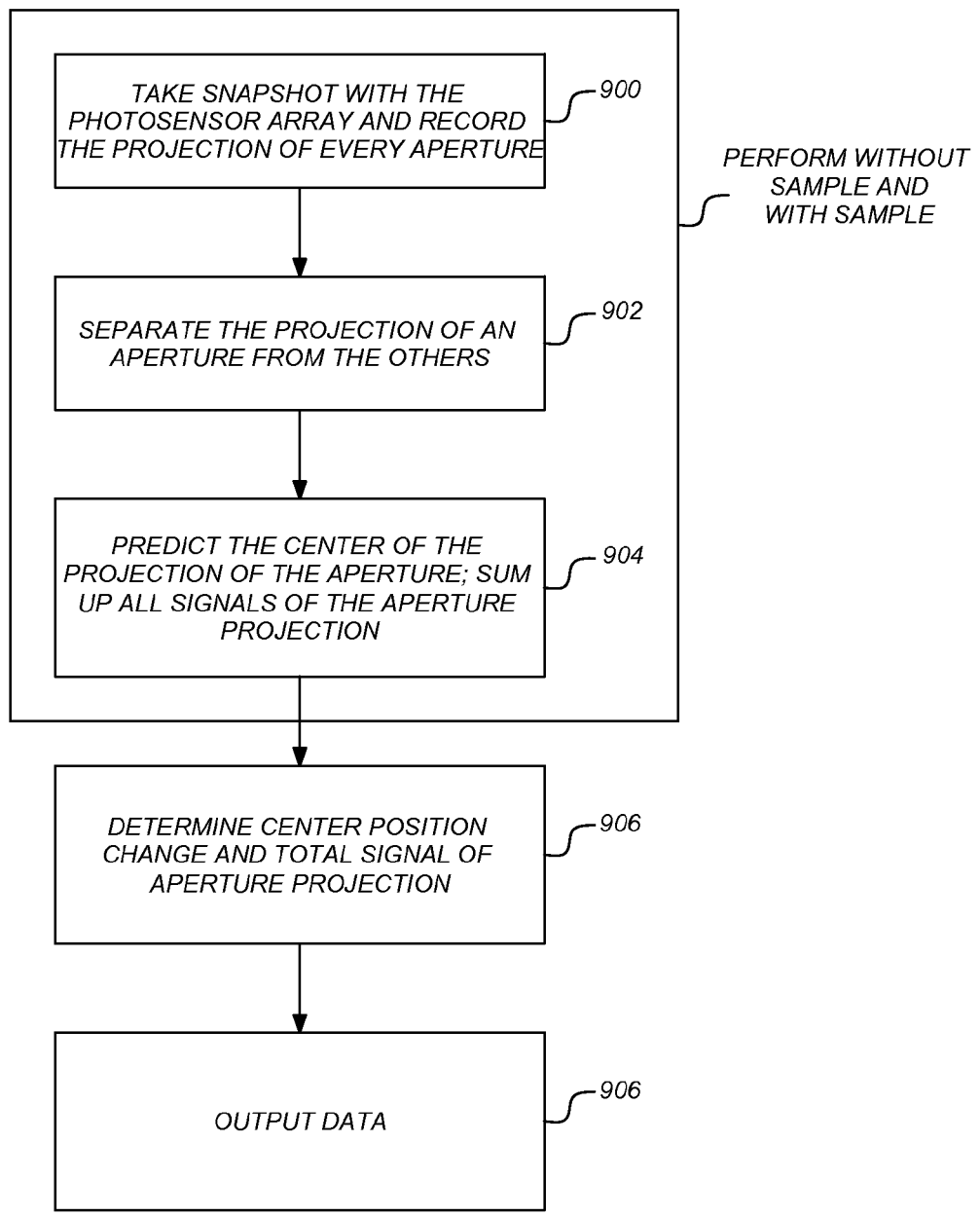
FIG. 9 is a flowchart illustrating the processing of data received in a photodetector array in accordance with one or more embodiments of the invention.

Once a wavefront has been received at the photodetector array, embodiments of the invention provide the ability to analyze the received data and output an image or information based on such data analysis. FIG. 9 is a flowchart illustrating the processing of the data received at the photodetector array in accordance with one or more embodiments of the invention. FIG. 9 will be described in relation to FIG. 10A which illustrates a side view of a wavefront sensor and FIG. 10B which illustrates a top down view of the photodetector array 1010 with signals received thereon.

Figure 10A:
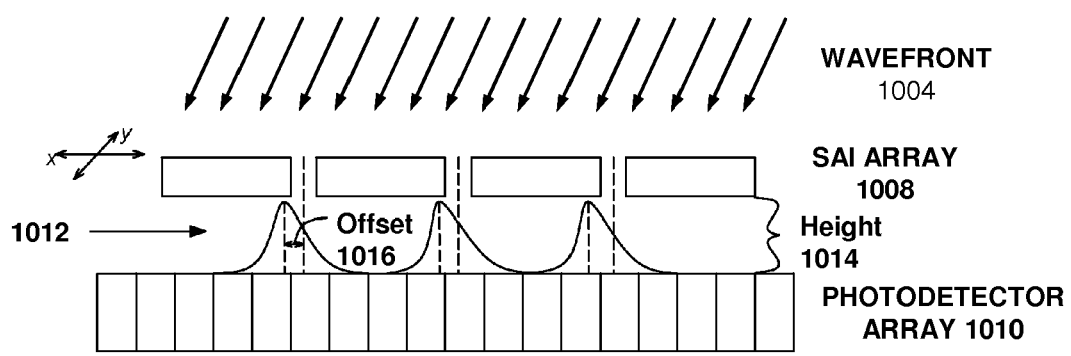
FIG. 10A illustrates a side view of a wavefront sensor in accordance with one or more embodiments of the invention.
Figure 10B:
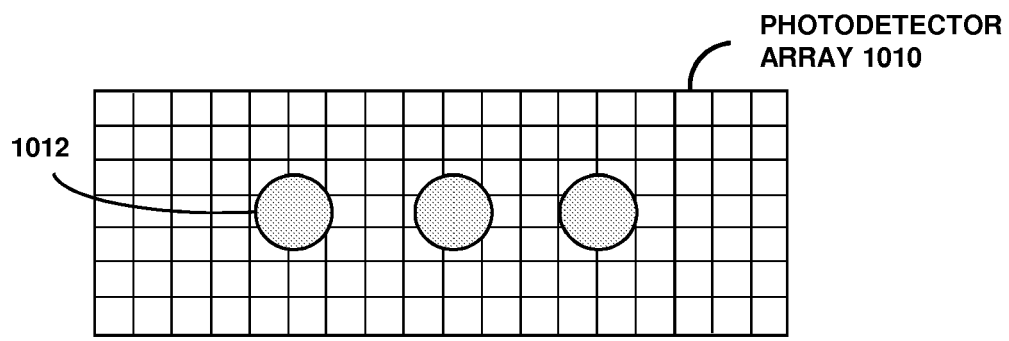
FIG. 10B illustrates a top down view of a photodetector array of FIG. 10A with signals received thereon in accordance with one or more embodiments of the invention.

In FIG. 10A, a wavefront 1004 (e.g., from a wavefront relay system) is received at the SA array 1008. The SA array 1008 causes the wavefront 1004 to project onto the photodetector array 1010. The distribution/intensity of the wavefront signals 1004 received on the photodetector array 1010 is illustrated in FIG. 10A as wave 1012 and in FIG. 10B by the circles 1012. In this regard, at step 900, a snapshot (via the illumination via wavefront 1004) is taken at the photodetector array 1010. At step 900, the projection of every hole is also recorded. It may be noted that while there are multiple photosensors in the photodetector array 1010, the different photosensors may be cumulatively used or a single photosensor may be used to provide a single datapoint that is used in accordance with embodiments of the invention.

At step 902, the projection of the hole/aperture is separated from all other projections. Such a separation may be performed by suppressing the crosstalk from neighboring hole projections iteratively. Any variety of methods may be used to separate the projections of the wavefront 1004 through the SA array 1008. For example, in one embodiment, a maximum intensity value (e.g., in FIG. 10A) is found and a determination is made regarding when the intensity value decreases. The wave projection is followed to determine when the intensity value begins to rise again (i.e., signaling the wavefront from an adjacent aperture). The midpoint between two maximum intensity values can be used to suppress cross talk and separate the projections. Alternatively, the height 1014 (i.e., between the SA array 1008 and the photodetector array 1010) can be established and the distribution 1012 can be examined to determine the peak/maximum pixel. A defined number of pixels can be used on each side of the peak signal (e.g., from the center of the projection) to define the projections from individual apertures. However, any variety of techniques can be used to separate out the pixels/projections. Such a separation is useful to map the different regions of the photodetector array 1010 to the appropriate aperture in the SA array 1008.

At step 904, the center of the projection of the hole/aperture is predicted. Any methodology can be used for this prediction including the examination of the intensity values (e.g., as described above with respect to the separation of the projection of the holes). Step 904 may also include the summing of all signals of the hole projections.

Steps 900-904 are performed twice. The first time steps 900-904 are performed, no sample is used. Such a performance serves to initialize the system and determine base measurements to be used to determine the phase gradient. The second time steps 900-904 are performed, a sample is utilized such that the projections will be diffracted differently (compared to the projections without the sample).

At step 906, the center position change of the hole projection (i.e., the offset 1016) is determined. Such an offset may be determined in both the X and Y directions. This center position change/offset 1016 is directly related to the phase gradient of the wavefront at the hole (i.e., the offset divided by the height may provide the phase gradient). In addition, at step 906, the total signal of the hole projection is determined which is proportional to the intensity of the wavefront at the hole.

The phase gradient of the wavefront along any direction can be calculated based on the phase gradient of the wavefront along $$X\left(\frac{\partial \phi}{\partial x}\right) \text{ and } Y\left(\frac{\partial \phi}{\partial y}\right)$$

directions acquired as described above. It is because the phase of a wavefront is a fixed scalar potential function, and the phase gradient of the wavefront along any direction $$\left|\frac{\partial \phi}{\partial \vec{n}}\right|$$

can be represented as the inner product of the unit direction vector $\vec{n}$ and the gradient vector of the phase $\vec{\nabla} \phi$.

$$\left|\frac{\partial \phi}{\partial \vec{n}}\right| = \vec{n} \cdot \vec{\nabla} \phi = \vec{n} \cdot \left(\frac{\partial \phi}{\partial x}\vec{i} + \frac{\partial \phi}{\partial y}\vec{j}\right)$$

At step 906, the data can be output. For example, the angles of the projections (i.e., the direction of the light at a particular point) can be plot into a 2D image that reflects how the light is diffracted by the sample. The structure of the sample can therefore be displayed in an image using the phase gradient.

Figure 11:
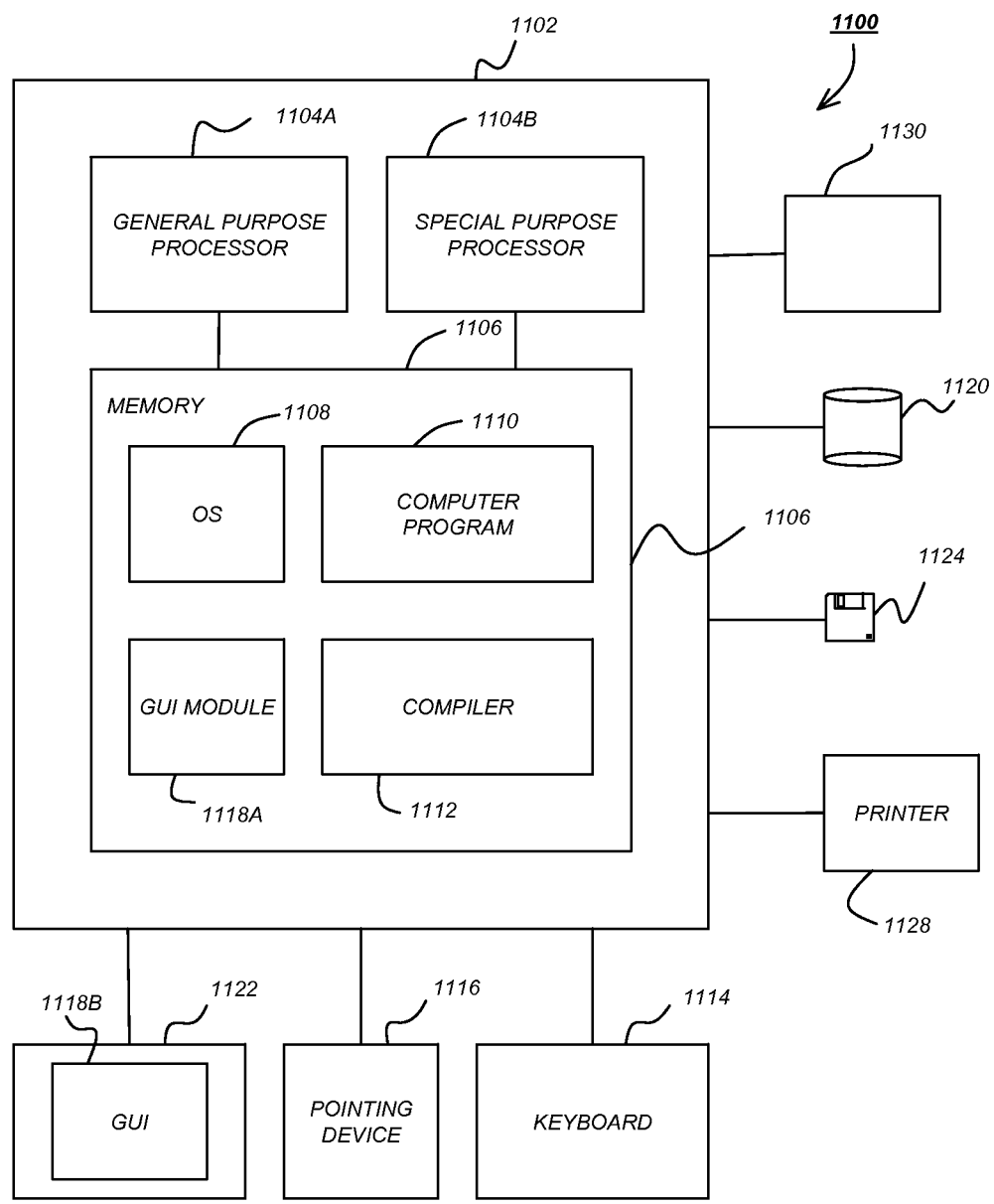
FIG. 11 is an exemplary hardware and software environment used to implement one or more embodiments of the invention.

Such processing of FIG. 9 may be performed by the computer illustrated in FIG. 11. In this regard, FIG. 11 is an exemplary hardware and software environment 1100 used to implement one or more embodiments of the invention. Computer 1102 may be a user computer, server computer, or may be a database computer. The computer 1102 comprises a general purpose hardware processor 1104A and/or a special purpose hardware processor 1104B (hereinafter alternatively collectively referred to as processor 1104) and a memory 1106, such as random access memory (RAM). The computer 1102 may be coupled to other devices, including input/output (I/O) devices such as a keyboard 1114, a mouse device 1116 and a printer 1128.

In one embodiment, the computer 1102 operates by the general purpose processor 1104A performing instructions defined by the computer program 1110 under control of an operating system 1108. The computer program 1110 and/or the operating system 1108 may be stored in the memory 1106 and may interface with the user and/or other devices to accept input and commands and, based on such input and commands and the instructions defined by the computer program 1110 and operating system 1108 to provide output and results.

Output/results may be presented on the display 1122 or provided to another device for presentation or further processing or action. In one embodiment, the display 1122 comprises a liquid crystal display (LCD) having a plurality of separately addressable liquid crystals. Each liquid crystal of the display 1122 changes to an opaque or translucent state to form a part of the image on the display in response to the data or information generated by the processor 1104 from the application of the instructions of the computer program 1110 and/or operating system 1108 to the input and commands.

The image may be provided through a graphical user interface (GUI) module 1118B. Although the GUI module 1118B is depicted as a separate module, the instructions performing the GUI functions can be resident or distributed in the operating system 1108, the computer program 1110, or implemented with special purpose memory and processors.

Some or all of the operations performed by the computer 1102 according to the computer program 1110 instructions may be implemented in a special purpose processor 1104B. In this embodiment, the some or all of the computer program 1110 instructions may be implemented via firmware instructions stored in a read only memory (ROM), a programmable read only memory (PROM) or flash memory within the special purpose processor 1104B or in memory 1106. The special purpose processor 1104B may also be hardwired through circuit design to perform some or all of the operations to implement the present invention. Further, the special purpose processor 1104B may be a hybrid processor, which includes dedicated circuitry for performing a subset of functions, and other circuits for performing more general functions such as responding to computer program instructions. In one embodiment, the special purpose processor is an application specific integrated circuit (ASIC).

The computer 1102 may also implement a compiler 1112 which allows an application program 1110 written in a programming language such as COBOL, Pascal, C++, FORTRAN, or other language to be translated into processor 1104 readable code. After completion, the application or computer program 1110 accesses and manipulates data accepted from I/O devices and stored in the memory 1106 of the computer 1102 using the relationships and logic that was generated using the compiler 1112.

The computer 1102 also optionally comprises an external communication device such as a modem, satellite link, Ethernet card, or other device for accepting input from and providing output to other computers or from the photodetector array device of the invention.

In one embodiment, instructions implementing the operating system 1108, the computer program 1110, and the compiler 1112 are tangibly embodied in a computer-readable medium, e.g., data storage device 1120, which could include one or more fixed or removable data storage devices, such as a zip drive, floppy disc drive 1124, hard drive, CD-ROM drive, tape drive, etc. Further, the operating system 1108 and the computer program 1110 are comprised of computer program instructions which, when accessed, read and executed by the computer 1102, causes the computer 1102 to perform the steps necessary to implement and/or use the present invention or to load the program of instructions into a memory, thus creating a special purpose data structure causing the computer to operate as a specially programmed computer executing the method steps described herein. Computer program 1110 and/or operating instructions may also be tangibly embodied in memory 1106 and/or data communications devices 1130, thereby making a computer program product or article of manufacture according to the invention. As such, the terms "article of manufacture," "program storage device" and "computer program product" as used herein are intended to encompass a computer program accessible from any computer readable device or media.

Of course, those skilled in the art will recognize that any combination of the above components, or any number of different components, peripherals, and other devices, may be used with the computer 1102.

Although the term "user computer" is referred to herein, it is understood that a user computer 1102 may include portable devices such as cellphones, notebook computers, pocket computers, or any other device with suitable processing, communication, and input/output capability.

Implementation Details

As described above, the SA wavefront sensor may be used in a DIC microscope system in accordance with one or more embodiments of the invention. In one or more embodiments, the structured-apertures consist of four holes (1 µm diameter, 1 µm center-to-center spacing, with the two long axes in the orthogonal x- and y-directions respectively) defined in a sliver film (100 nm thick) above a CMOS image sensor (e.g., the image sensor offered by Micron MT9V403™) (FIG. 12(c)).

Figure 12:
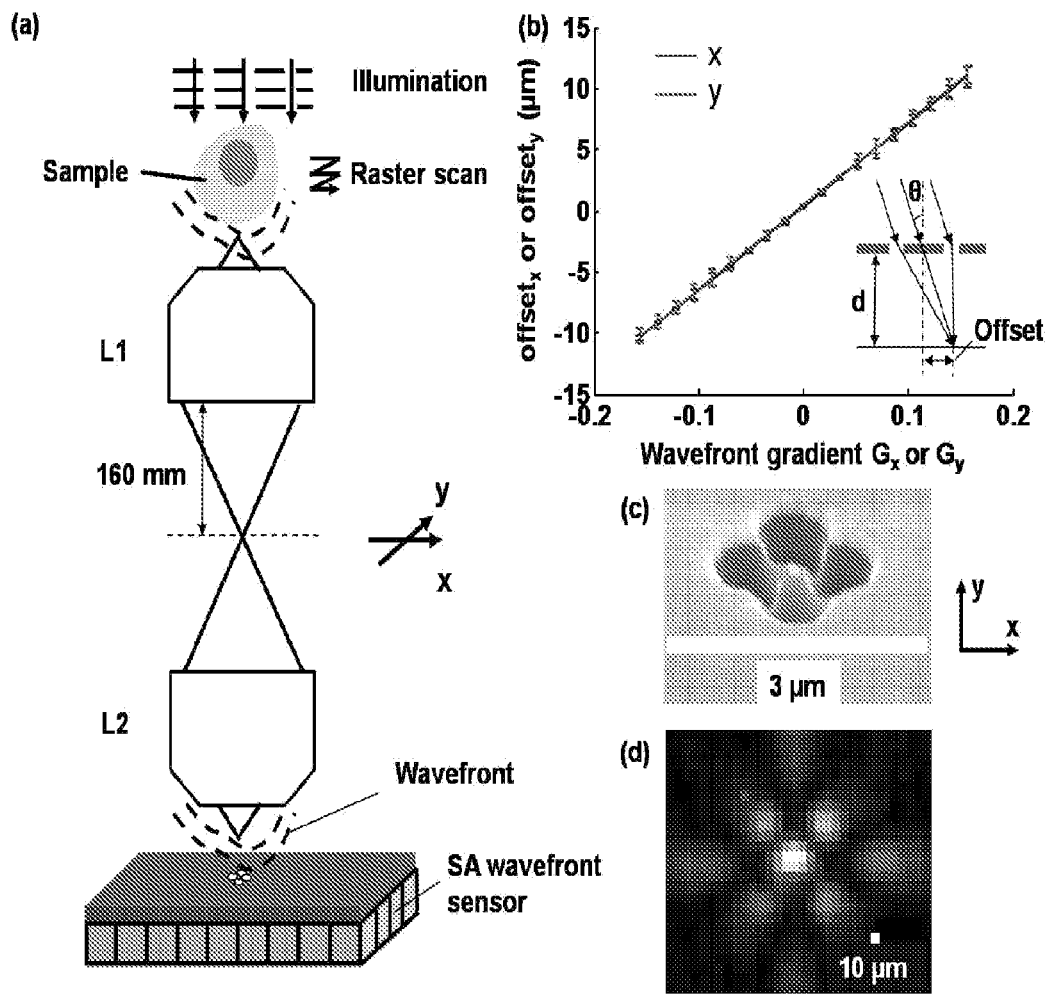
FIG. 12(a) illustrates a configuration of a structured aperture differential contrast microscope used in accordance with one or more embodiments of the invention.
FIG. 12(b) illustrates a graph of an offset of a zero-order interference spot of the structured aperture of FIG. 12(c) and wavefront gradient in accordance with one or more embodiments of the invention.
FIG. 12(c) illustrates a scanning electron microscope image of a structured aperture defined on silver film in accordance with one or more embodiments of the invention.
FIG. 12(d) illustrates a resulting interference pattern of the structured aperture recorded by a CMOS (complementary metal-oxide-semiconductor) image sensor in accordance with one or more embodiments of the invention.

The holes and the CMOS sensor are separated by an 80 µm thick layer of SU-8 resin, depicted as "d" in FIG. 12(b) (measured by a Thorlabs™ optical coherence tomography system [e.g., OCMP1300SS™]). By placing the SA wavefront sensor in the image plane of a standard microscope system, the four holes will selectively transmit and combine the light fields from four adjacent points on the image to create an interference pattern on the CMOS sensor. The total transmission of the interference is proportional to the average image intensity at the aperture. In addition to the spacer thickness "d", the offsets offset$_x$(x, y) and offset$_y$(x, y) of the zero-order interference spot are related to the net wavefront gradient $G_x$(x, y) and $G_y$(x, y) at the aperture respectively [7]:

$$G_x(x, y) = \frac{1}{\sqrt{1 + \left(\frac{d}{offset_x(x, y)}\right)^2}} \quad (3)$$

$$G_y(x, y) = \frac{1}{\sqrt{1 + \left(\frac{d}{offset_y(x, y)}\right)^2}}.$$

The relative simplicity and absence of image intensity-related terms makes this a particularly appealing way to measure the wavefront gradient. In addition, this approach provides the ability to measure the wavefront gradient in both image-plane spatial dimensions simultaneously.

The exact proportionality of a device may be experimentally determined by measuring the interference pattern as illustrated in FIG. 12(d). Referring to FIG. 12(a), the SA wavefront sensor is illuminated with a collimated He—Ne laser beam (632.8 nm wavelength, 25 mm beam diameter and 4 mW power) from a range of incident angles. A least-square 2D Gaussian fit is used to compute the total transmission and the offsets (offset$_x$ and offset$_y$) of the zero-order spot in both x- and y-directions.

FIG. 12(b) shows the relationship between offset$_x$(offset$_y$) of the zero-order spot and the wavefront gradient $G_x$ ($G_y$). Both curves are approximately linear in the measurement ranges. This is consistent with the geometric optics prediction: offset$_x$=d tan(θ)≈dG$_x$, and similarly for offset$_y$, where θ is the incident angle of the laser beam and when the angle is small. The experimentally measured proportionality from FIG. 12(b) was 70 µm while the predicted value from thickness "d" measurement was 80 µm. Finally, it may be noted that this SA wavefront sensor works with broadband light sources and the zero-order interference spots coincide spatially for all wavelengths. As can be seen in FIG. 12(b), the offset of x of the zero-order interference spot of the structured aperture is linearly proportional to the wavefront gradient $G_x$($G_y$) along the x-(y-) direction in a defined measurement range.

FIG. 12(a) illustrates an experimental scheme of an SA-DIC microscope used in accordance with one or more embodiments of the invention. Two 20× objective lenses (Newport M-20×™) are aligned such that their rear conjugate planes (160 mm behind the objective lens) overlap. The sample is placed at the front conjugate plane of the top objective (L1), and illuminated with a collimated white light (halogen lamp, 200 mW/cm$^2$). Since the microscope system is symmetric, a 1:1 image of the sample is formed at the front conjugate plane of the bottom objective (L2). This image is equivalent to the convolution of the input sample light field with the PSF (point spread function) of the microscope system.

The SA wavefront sensor may be placed at the center of the image plane. Once placed, the sample may be raster-scanned (e.g., by two Newport CMH-25CCCL™ actuators) in the x-y plane to complete the mapping of the intensity and wavefront gradient of the image. During the imaging process, the illumination, the optical system and the sensor may be fixed with respect to each other. Such positioning/fixation provides stable and precise measurement with a simple optical system.

Figure 13:
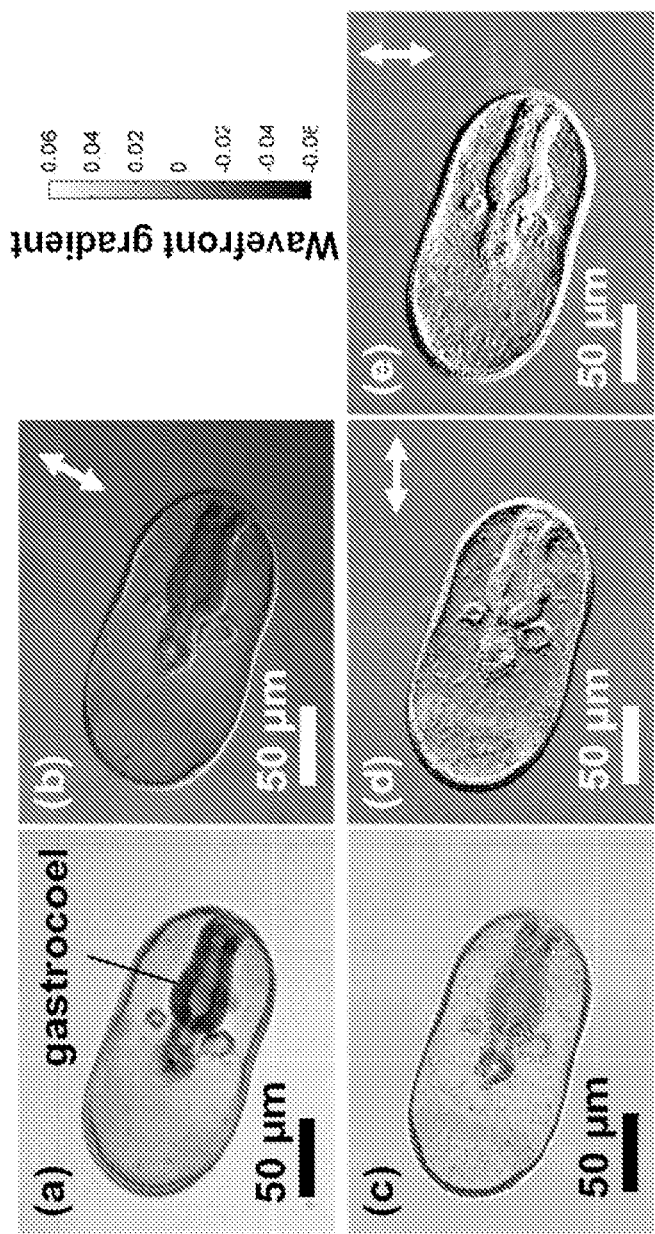
FIGS. 13(a)-13(e) illustrates images of starfish embryo.

To demonstrate the quantitative DIC sensing capability and its application in biological imaging, a starfish embryo (Carolina Scientific™) may be used as a test sample. FIG. 13(a) shows a microscope (e.g., Olympus BX41™) image of the sample acquired with a 10× objective. FIG. 13(b) is the corresponding image under a standard DIC microscope (Zeiss Axioplan™, 40× objective). FIG. 13(c-e) show the intensity, X and Y DIC phase images acquired by a microscope with a single scan in accordance with one or more embodiments of the invention. The spatial sampling step size was 0.5 µm in both x- and y-directions, and the exposure time associated with each sampling point was 8 ms.

The conventional transmission microscope image and the SA-DIC intensity image are consistent with each other. However, the SA-DIC phase images (i.e., FIG. 13(c)-13(e) appear to be different from the conventional DIC image. Such differences result because the SA-DIC phase images purely maps the wavefront gradients while the conventional DIC image contains some intensity image variations. This distinction is particularly apparent when one compares the embryo's gastrocoel for all of the images. The image intensity associated with the gastrocoel region was low and the region appeared darker in the conventional DIC image. In comparison, the corresponding areas of the SA-DIC phase images do not appear darker because they are pure phase maps. Finally, it may be noted that the SA-DIC phase and amplitude images are also an improvement over conventional DIC images in that they are quantitative maps. The wavefront gradient sensitivity of operating in the above described experimental conditions is approximately 4 mrad; the sensitivity can be improved by using a better sensor platform, increasing measurement time and/or increasing the illumination intensity. [7]

Figure 14:
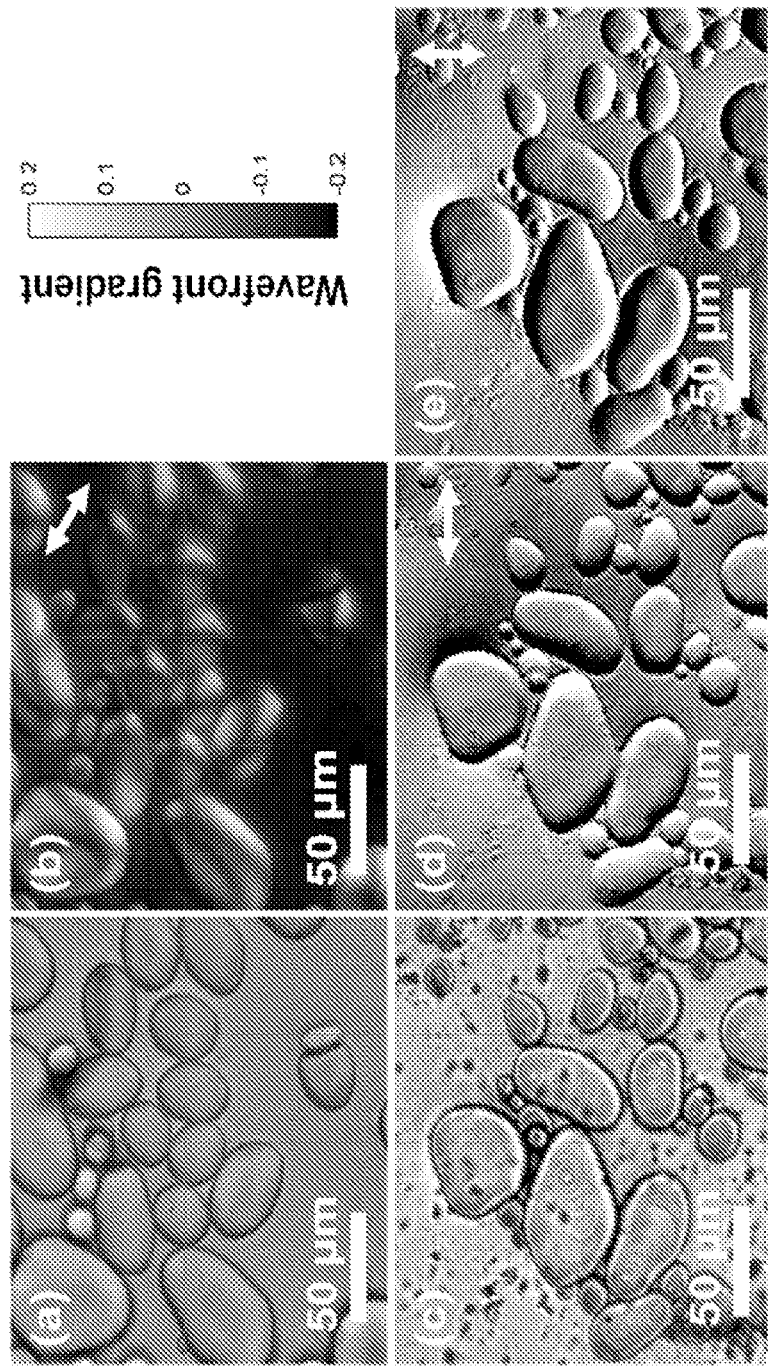
FIGS. 14(a)-(e) illustrates images of potato starch storage granules in microscope immersion oil.

The ability to image birefringent samples properly is yet another advantage of embodiments of the present invention. Birefringent objects, such as the potato starch storage granules, can alter the polarization of the two displaced light fields in a conventional DIC microscope, such that the subsequent combination of the two fields is no longer describable by Eq. (1). This can give rise to Maltese-cross artifacts in the resulting conventional DIC images (as illustrated in FIG. 14(b). Since the SA-DIC microscope uses unpolarized illumination and does not rely on polarization for image processing, it can image birefringent samples without artifacts, as shown in FIG. 14(d) and (e). It is also worth noting that the dark absorption spots of the starch granules in the center of the intensity images (FIG. 14(c)) do not appear in SA-DIC phase images (FIG. 14(d) and (e)). This is another clear indication that the SA-DIC microscope can separate the intensity variations of the image wavefront from the phase variations.

Figure 15:
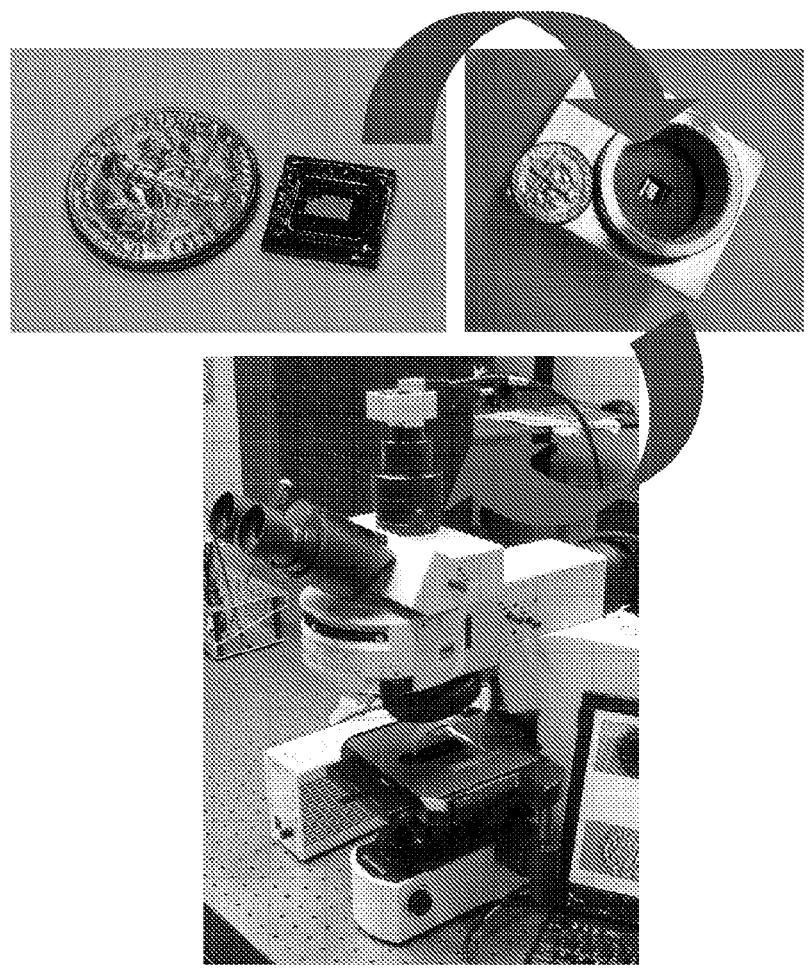
FIG. 15 illustrates a completed wavefront-sensing sensor chip (top left), a camera port housing for the chip (top right), and the use of the entire unit plugged into a camera port of a microscope in accordance with one or more embodiments of the invention.

FIG. 15 illustrates a completed wavefront-sensing sensor chip (top left), a camera port housing for the chip (top right), and the use of the entire unit plugged into a camera port of a microscope in accordance with one or more embodiments of the invention. Such a use provides for the integration of the DIC functionality of the microscope onto the detector whereas conventional DIC microscopy methods use bulky optical elements in the microscope itself.

The aperture size may impact several aspects of the system performance. The SA-DIC microscope resolution may be limited by the numerical aperture of the collection optics or the aperture size divided by the system's magnification (M). By limiting the system magnification, a resolution equal to the aperture size (2 μm) may result (e.g., an imaging system with M=1). A system can be created that is limited by the numerical aperture of the collection optics by either increasing M or decreasing the aperture size.

A smaller aperture can lead to a decreased sensitivity of the wavefront gradient measurement for two reasons. Firstly, a smaller aperture will lead to a broader interference pattern which can negatively impact the ability to determine the offsets of the zero order intereference spot [8]. Secondly, a smaller aperture will transmit less light and therefore lead to an overall decease in the detected signal.

In conclusion, one can demonstrate a high-resolution and artifact-free quantitative DIC microscopy method based on the SA wavefront sensor. The method can simultaneously generate one intensity and two orthogonal wavefront gradient images. Unlike a conventional DIC microscope, SA-DIC is capable of imaging birefringent samples without artifactual image errors. Further, imaging speed can be increased by using more sensitive detectors, e.g. avalanche photodiode (APD) array, employing faster scanning system, and/or parallelizing the imaging process [9][10].

CONCLUSION

As described above, one or more embodiments of the invention provide various different types of and methods for utilizing a wavefront sensor. A wavefront microscope or camera may include a light source, a wavefront relay system, a wavefront sensor, and an output mechanism. DIC functionality of the microscope or camera may be integrated into the wavefront sensor.

The light source of the microscope or camera is configured to illuminate a sample.

The wavefront relay system is configured to relay a wavefront generated by the sample.

The wavefront sensor is configured to receive the wavefront from the relay system, measure a local intensity of the wavefront, and measure a phase gradient of the wavefront. The wavefront sensor may be a single pixel wavefront sensor where the different measurements and image maps are obtained via raster scanning. Alternatively, the sensor may be a wavefront sensor array where the measurements and images consist of a snapshot of the entire sample.

The wavefront sensor may be configured as a Shack-Hartmann type device that consists of a microlens array that focuses the wavefront across each lens of the array and forms a spot onto a photodetector array. The photodetector array outputs a measurement of the phase gradient of the wavefront and the local intensity of the wavefront.

Whether used in the wavefront microscope or in any other type of imaging device, embodiments of the invention may provide a specific type of wavefront sensor using structured apertures. In such a device, a metal film has one or more patterned structured 2D apertures configured to convert a phase gradient of the wavefront into a measurable form. A photodetector array receives the wavefront projected through the apertures and outputs a measurement of the phase gradient and local intensity of the wavefront.

The output mechanism outputs a local intensity 2D image map and a phase gradient 2D image map (e.g., onto a display device). In addition, the output mechanism may further analyze the data. Such an analysis may receive a recording of signals of the wavefront projected onto the photodetector array. A computer (e.g., computer processor) may be used to separate the signals from the projection of one patterned structured aperture from the other apertures. Such a separation may be performed by suppressing the crosstalk from neighbor hole projections iteratively. All signals of the projections for each aperture are summed together and is proportional to an intensity of the wavefront. A center of the projection from each aperture is predicted. A center position change from the predicted center (based on snapshots taken with and without the sample in place) is determined and is directly related to the phase gradient of the wavefront (i.e., of the sample).

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

[1] C. J. Cogswell and C. J. R. Sheppard, Journal of Microscopy-Oxford 165, 81 (1992).
[2] M. W. Davidson, M. Abramowitz, "Differential Interference Contrast, "Comparison of Wavefront and DIC Microscopy", Florida State University website (1998-2005).
[3] Ben C. Platt and Roland Shack, History and Principles of Shack-Hartmann Wavefront Sensing, Journal of Refractive Surgery 17, S573-S577 (September/October 2001).
[4] Shack-Hartmann, Wikipedia (Mar. 30, 2009).
[5] M. J. Booth, M. A. A. Neil, R. Juskaitis, T. Wilson, Proceedings of the National Academy of Sciences of the United States of America 99, 5788 (April, 2002).
[6] J. Z. Liang, D. R. Williams, D. T. Miller, Journal of the Optical Society of America a-Optics Image Science and Vision 14, 2884 (November, 1997).
[7] M. Lew, X. Cui, X. Heng and C. Yang, Optics Letters 32, 3 and 2963 (2007).
[8] R. E. Thompson, D. R. Larson and W. W. Webb, Biophysical Journal 82, 2775 (2002).
[9] X. Heng, D. Erickson, L. R. Baugh, Z. Yaqoob, P. W. Sternberg, D. Psaltis and C. H. Yang, Lab on a Chip 6, 1274 (2006).
[10] X. Cui, X. Heng, J. Wu, Z. Yaqoob, A. Scherer, D. Psaltis and C. Yang, Optics Letters 31, 3161 (2006).
[11] P. Marquet, B. Rappaz, P. J. Magistretti, E. Cuche, Y. Emery, T. Colomb and C. Depeursinge, Optics Letters 30, 468 (2005).
[12] W. Choi, C. Fang-Yen, K. Badizadegan, S. Oh, N. Lue, R. R. Dasari and M. S. Feld, Nature Methods 4, 717 (2007).
[13] Xiquan Cui, Matthew Lew, and Changhuei Yang; "Quantitative differential interference contrast microscopy based on structured-aperture interference", Applied Physics Letters Vol 93 (9), 091113 (2008); NIHMSID: 111214)
[14] John Daniel Kraus and Daniel A. Fleisch, Electromagnetics with Applications ($5^{th}$ Ed)., Chapters 4-16 (1999).

What is claimed is:

1. A wavefront microscope comprising:
   (a) a light source configured to illuminate a sample;
   (b) a wavefront relay system configured to relay a wavefront generated by the sample;
   (c) a wavefront sensor configured to:
      (i) receive the wavefront from the wavefront relay system;
      (ii) measure a local intensity of the wavefront; and
      (iii) measure a phase gradient of the wavefront; and
   (d) an output mechanism for outputting a local intensity two dimensional (2D) image map and a phase gradient 2D image map.

2. The wavefront microscope of claim 1, wherein:
   (a) the wavefront sensor comprises a single pixel wavefront sensor; and
   (b) the local intensity 2D image map and phase gradient 2D image map are obtained via raster scanning.

3. The wavefront microscope of claim 1, wherein:
   (a) the wavefront sensor comprises a wavefront sensor array; and
   (b) the local intensity 2D image map and phase gradient 2D image map comprise a snapshot of the entire sample.

4. The wavefront microscope of claim 1, wherein the wavefront sensor comprises:
   (a) a metal film having one or more patterned structured 2D apertures configured to convert the phase gradient of the wavefront into a measurable form; and
   (b) a photodetector array configured to:
      (i) receive the wavefront projected through the one or more 2D apertures; and
      (ii) output a measurement of:
         (1) the phase gradient of the wavefront; and
         (2) the local intensity of the wavefront.

5. The wavefront microscope of claim 1, wherein the wavefront sensor comprises:
   (a) a microlenses array configured to focus the wavefront across each lens of the microlenses array and form a spot onto a photosensor array; and
   (b) the photosensor array configured to output a measurement of:
      (i) the phase gradient of the wavefront; and
      (ii) the local intensity of the wavefront.

6. The wavefront microscope of claim 1, wherein differential interference contrast (DIC) functionality of the wavefront microscope is integrated into the wavefront sensor.

7. A wavefront sensor comprising:
   (a) a metal film having one or more patterned structured two dimensional (2D) apertures configured to convert a phase gradient of a wavefront into a measurable form; and
   (b) a photodetector array configured to:
      (i) receive the wavefront projected through the one or more 2D apertures; and
      (ii) output a measurement of:
         (1) the phase gradient of the wavefront; and
         (2) an intensity of the wavefront.

8. The wavefront sensor of claim 7, wherein multiple apertures are arranged into a two-dimensional wavefront sensor array.

9. The wavefront sensor of claim 7, wherein the patterned structured 2D apertures comprise a Fresnel zone plate.

10. A method for measuring a wavefront in a wavefront microscope comprising:
    (a) illuminating a sample;
    (b) relaying the wavefront generated by the sample;
    (c) receiving the relayed wavefront at a wavefront sensor;
    (d) measuring, using the wavefront sensor, a local intensity of the wavefront;
    (e) measuring, using the wavefront sensor, a phase gradient of the wavefront; and
    (f) outputting a local intensity two dimensional (2D) image map and a phase gradient 2D image map based on the local intensity and phase gradient.

11. The method of claim 10, wherein
    (a) the wavefront sensor comprises a single pixel wavefront sensor; and
    (b) the local intensity 2D image map and phase gradient 2D image map are obtained via raster scanning.

12. The method of claim 10, wherein
    (a) the wavefront sensor comprises a wavefront sensor array; and
    (b) the local intensity 2D image map and phase gradient 2D image map comprise a snapshot of the entire sample.

13. The method of claim 10, wherein the wavefront sensor comprises:
    (a) a metal film having one or more patterned structured 2D apertures configured to convert the phase gradient of the wavefront into a measurable form; and
    (b) a photodetector array configured to:
       (i) receive the wavefront projected through the one or more 2D apertures; and
       (ii) output a measurement of:
          (1) the phase gradient of the wavefront; and
          (2) the local intensity of the wavefront.

14. The method of claim 10, wherein the wavefront sensor comprises:
    (a) a microlenses array configured to focus the wavefront across each lens of the microlenses array and form a spot onto a photosensor array;
    (b) the photosensor array configured to output a measurement of:
       (i) the phase gradient of the wavefront; and
       (ii) the local intensity of the wavefront.

15. The method of claim 10, wherein differential interference contrast (DIC) functionality of the wavefront microscope is integrated into the wavefront sensor.

16. A method for detecting a wavefront comprising:
    (a) projecting the wavefront through a metal film having one or more patterned structured two dimensional (2D) apertures onto a photodetector array;
    (b) receiving, in the photodetector array, the wavefront projected through the one or more 2D apertures; and
    (c) outputting a measurement of:
       (1) a phase gradient of the wavefront; and
       (2) an intensity of the wavefront.

17. The method of claim 16, further comprising arranging multiple apertures into a 2D wavefront sensor array.

18. A method for measuring a wavefront in a wavefront camera system comprising:
    (a) illuminating an object;
    (b) relaying the wavefront generated by the object;
    (c) receiving the relayed wavefront at a wavefront sensor;
    (d) measuring, using the wavefront sensor, a local intensity of the wavefront;
    (e) measuring, using the wavefront sensor, a phase gradient of the wavefront; and
    (f) outputting a local intensity two dimensional (2D) image map and a phase gradient 2D image map based on the local intensity and phase gradient.

* * * * *